(12) United States Patent
Kuwazawa et al.

(10) Patent No.: US 7,285,764 B2
(45) Date of Patent: Oct. 23, 2007

(54) SOLID STATE IMAGING DEVICE AND METHOD OF DRIVING THE SAME

(75) Inventors: Kazunobu Kuwazawa, Chino (JP); Yutaka Maruo, Sakata (JP); Sanae Nishida, Suwa (JP); Yoshitaka Narita, Suwa (JP)

(73) Assignee: Seiko Epson Corporation (JP)

( * ) Notice: Subject to any disclaimer, the term of this patent is extended or adjusted under 35 U.S.C. 154(b) by 230 days.

(21) Appl. No.: 10/936,227

(22) Filed: Sep. 8, 2004

(65) Prior Publication Data

US 2005/0087781 A1    Apr. 28, 2005

(30) Foreign Application Priority Data

Sep. 9, 2003    (JP)    ............. 2003-316882

(51) Int. Cl.
*H01L 31/062* (2006.01)
*H01L 31/113* (2006.01)
*H01L 31/00* (2006.01)
*H04N 3/14* (2006.01)

(52) U.S. Cl. .............. 250/208.1; 250/214.1; 348/299; 348/308; 257/292; 438/5; 438/57

(58) Field of Classification Search ............. None
See application file for complete search history.

(56) References Cited

U.S. PATENT DOCUMENTS

| 6,946,638 | B2 * | 9/2005 | Kuwazawa et al. ...... 250/208.1 |
| 2005/0087773 | A1 * | 4/2005 | Kuwazawa ................. 257/218 |
| 2005/0088553 | A1 * | 4/2005 | Kuwazawa ................. 348/294 |
| 2005/0099517 | A1 * | 5/2005 | Kuwazawa ................. 348/308 |
| 2005/0110094 | A1 * | 5/2005 | Kuwazawa ................. 257/359 |
| 2006/0063295 | A1 * | 3/2006 | Kuwazawa ................. 438/60 |

FOREIGN PATENT DOCUMENTS

| JP | 08-293591 A | 11/1996 |
| JP | 11-205689 A | 7/1999 |
| JP | 11-261896 A | 9/1999 |
| JP | 2001-145024 A | 5/2001 |
| JP | 2001-238132 A | 8/2001 |
| JP | 2002-134729 | 5/2002 |
| JP | 2003-017677 A | 1/2003 |

* cited by examiner

*Primary Examiner*—David E. Graybill
(74) *Attorney, Agent, or Firm*—Harness, Dickey & Pierce, P.L.C.

(57) ABSTRACT

An imaging device comprising: a photoelectric conversion element generating photo-generated charges; an accumulation well accumulating the charges; a modulation well storing the charges; a modulation transistor having a channel threshold voltage controlled by the stored charges and outputting a corresponding signal; a transfer control element having a control end coupled to a control end of the modulation transistor and controlling the potential barrier of a transfer channel between the accumulation and modulation wells, and controlling transfer of the charges; an unwanted electric charge discharging control element controlling the potential barrier of an unwanted electric charge discharging channel coupled to the accumulation well, and discharging charges overflowing from the accumulation well during a period except for the charges transfer period; and a residual charge discharging control element controlling the potential barrier of a residual electric charge discharging channel coupled to the modulation well, and discharging residual charges in the modulation well.

10 Claims, 20 Drawing Sheets

FIG.7A
FIG.7B
FIG.7C
FIG.7D
FIG.7E

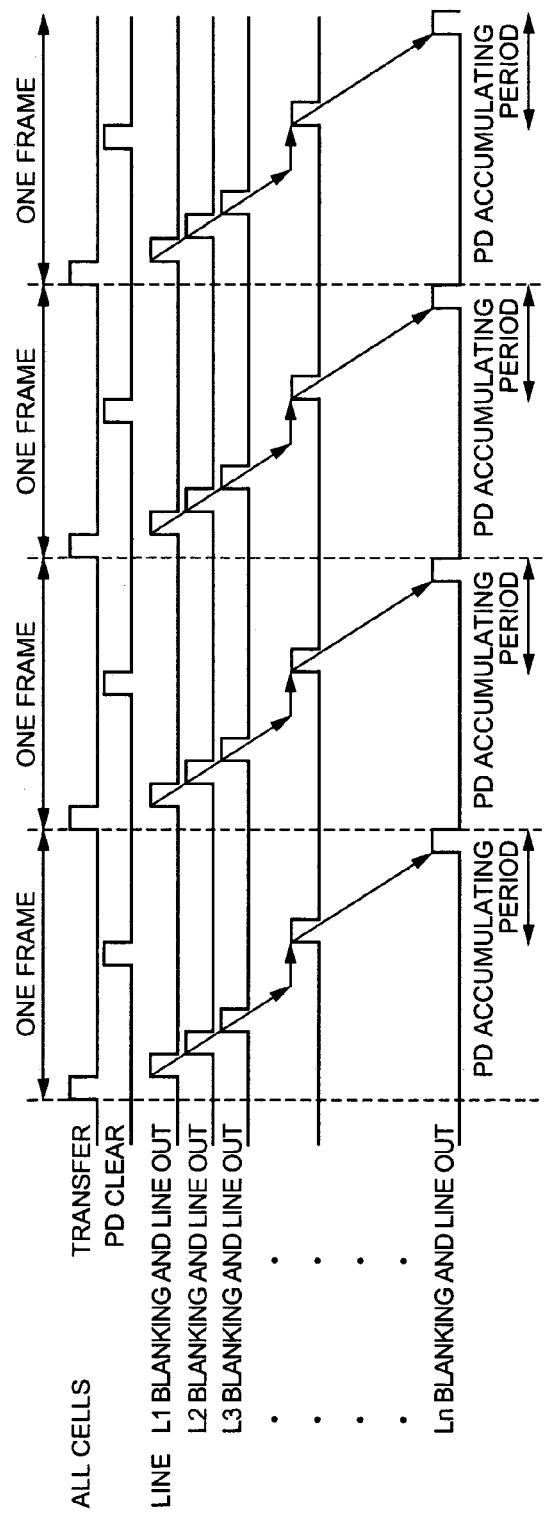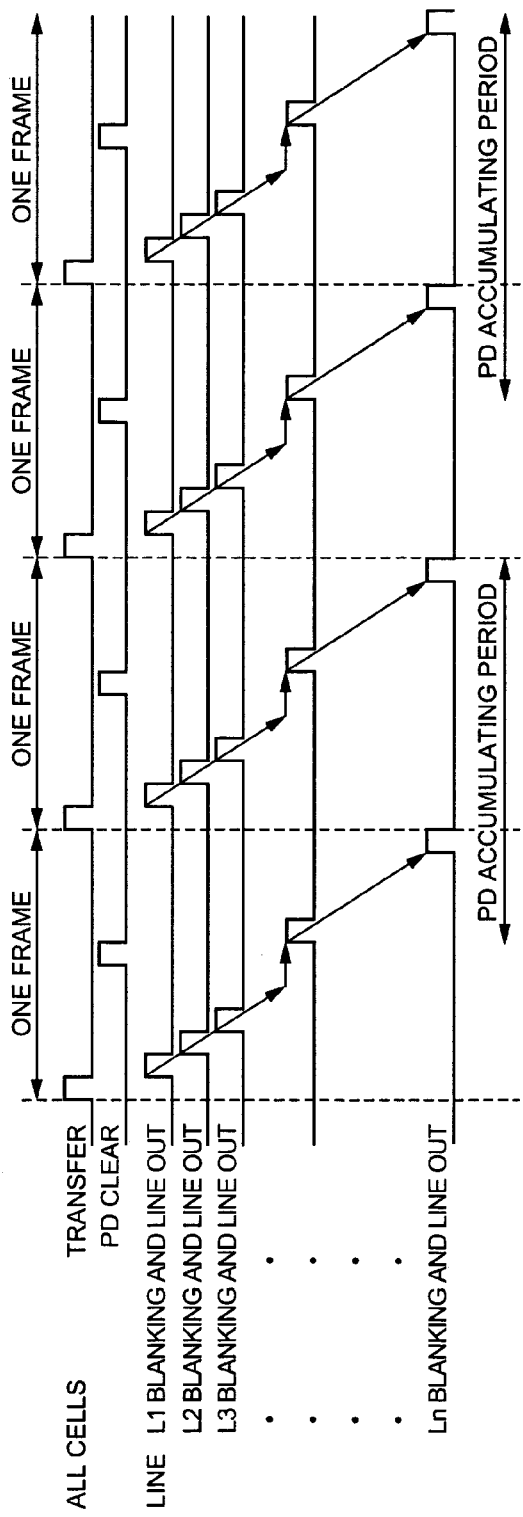

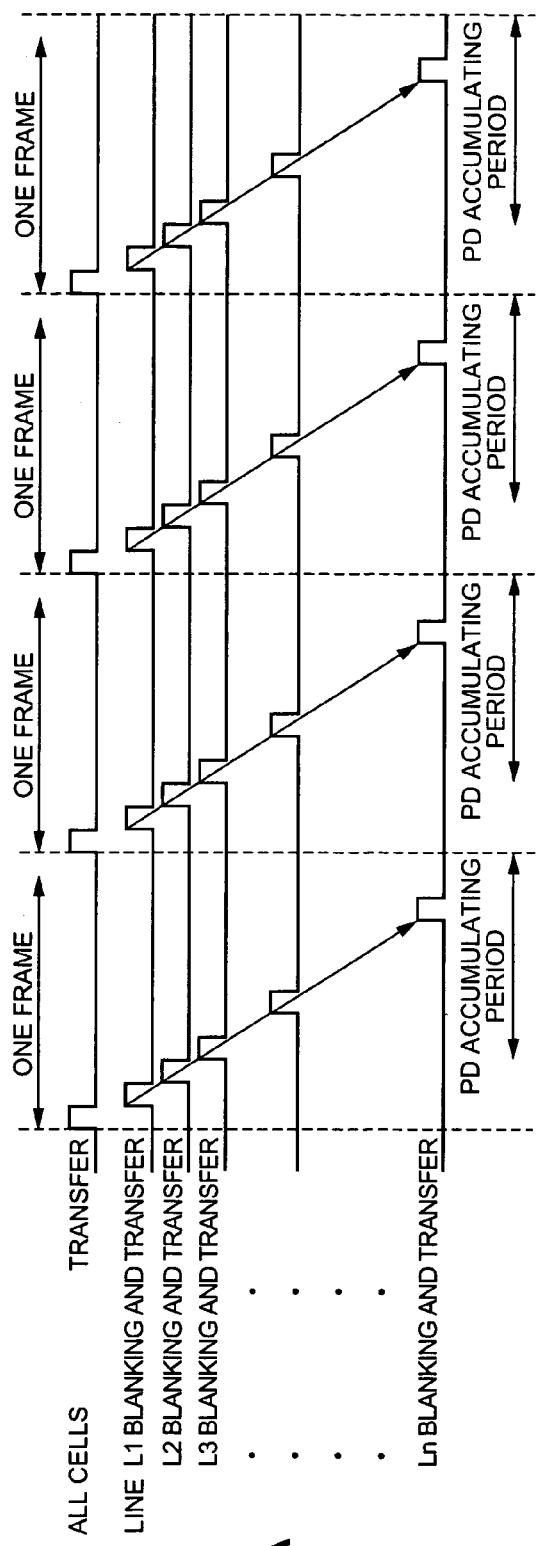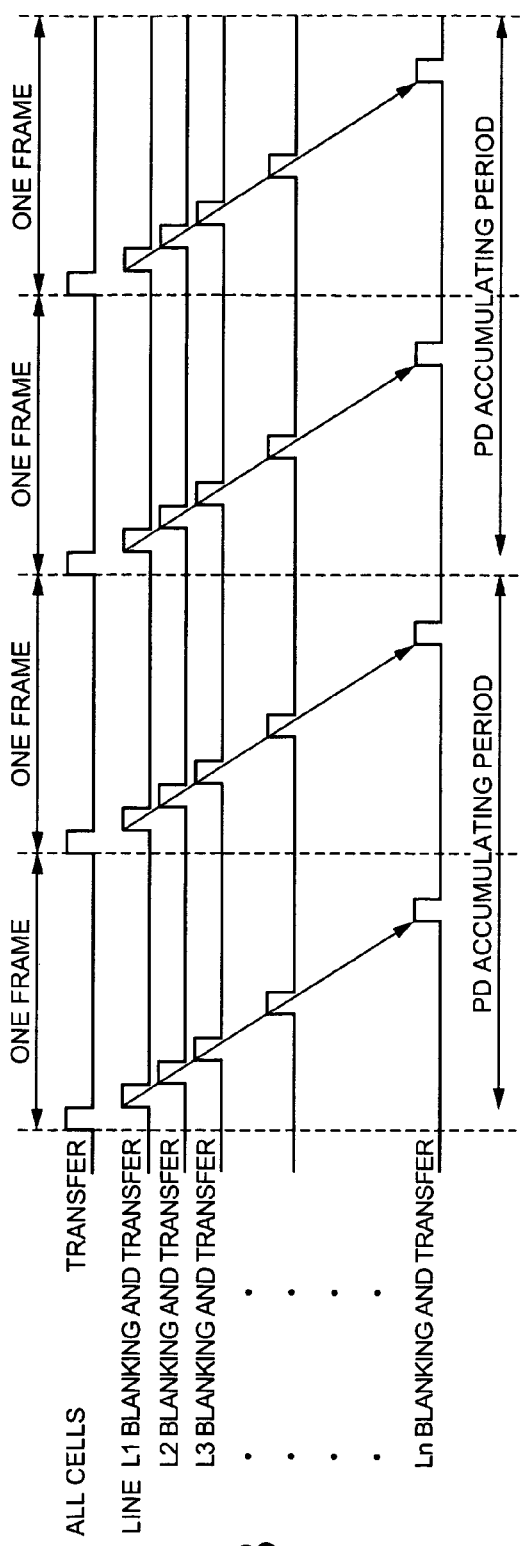

SOLID STATE IMAGING DEVICE AND METHOD OF DRIVING THE SAME

RELATED APPLICATIONS

This application claims priority to Japanese Patent Application No. 2003-316882 filed Sep. 9, 2003 which is hereby expressly incorporated by reference herein in its entirety.

BACKGROUND

1. Field of the Invention

The present invention relates to a solid state imaging device having a high quality picture and low power consumption, and a method of driving the same.

2. Description of Related Art

Solid state imaging devices carried in cellular phones or the like include a CCD (charge coupled device) type image sensor and a CMOS type image sensor. The CCD type image sensor is excellent in picture quality, and the CMOS type image sensor consumes lower power and its process cost is low. In recent years, MOS type solid state imaging devices using a threshold voltage modulation method which combines both high quality picture and low power consumption have been proposed. The MOS type solid state imaging device using the threshold voltage modulation method is disclosed in Japanese Unexamined Patent Publication No. 2002-134729, for example.

In the solid state imaging device of Japanese Unexamined Patent Publication No. 2002-134729, picture output is obtained by arranging unit pixels in a matrix form and repeating three states of initialization, accumulation, and reading. Moreover, in the solid state imaging device of Japanese Unexamined Patent Publication No. 2002-134729, each unit pixel has a photo-diode, a modulation transistor, and an overflow drain gate. The gate of the modulation transistor is formed in a ring shape.

Electric charges (photo-generated electric charges) generated by light incident upon the photo-diode are transferred to a P-type well region formed under a ring gate, and accumulated in a carrier pocket formed in this region. The threshold voltage of the modulation transistor changes corresponding to the photo-generated electric charges accumulated in the carrier pocket. Accordingly, signal (pixel signal) corresponding to incident light is obtained from a terminal coupled to the source region of the modulation transistor.

In the solid state imaging device of Japanese Unexamined Patent Publication No. 2002-134729, in order to prevent distortion produced when imaging a moving object, a picture made by an optical signal is simultaneously taken in on an entire light-receiving surface, and the optical signal thereof is converted to an electric signal and taken out to the outside as a picture signal. However, in this reading method, an accumulating period and a reading period cannot be controlled for each pixel because the picture made by the optical signal is simultaneously taken in on an entire light-receiving surface. Therefore, while specific pixels are being read, the accumulation operation cannot be carried out in other pixels, and as a result the frame rate cannot be enhanced.

Moreover, in the solid state imaging device of Japanese Unexamined Patent Publication No. 2002-134729, the photo-generated electric charges accumulated in a carrier pocket is discharged to an area under a P type well through an N type layer at the time of initialization. In other words, the photo-generated electric charges are discharged to a substrate through the N type layer. Therefore, the P type well having the carrier pocket is required to store a carrier during a reading period, and required to discharge this carrier during a discharging period. In order to satisfy such contradicting requirements, the thickness and an impurity concentration of each impurity layer should be precisely controlled, and the design flexibility will be remarkably damaged.

Furthermore, in the solid state imaging device of Japanese Unexamined Patent Publication No. 2002-134729, a part of the photo-generated electric charges generated in the photo-diode are discharged to the substrate through an overflow-drain region formed in a P type layer.

Incidentally, in the N type layer which constitutes the photo-diode, as the peak of the impurity concentration becomes deeper perpendicularly downward in the substrate, the wavelength range of photoelectric-convertible incident light becomes wider. That is, taking a higher quality picture into consideration, the depth of the N type layer needs to be deep enough. On the other hand, the overflow-drain region is composed of a deep P type layer extending from underneath an overflow drain gate to the rear surface of the substrate. This P type layer is formed by implanting P type impurities after forming the above-described N type layer. Therefore, in order to form the overflow-drain region composed of a deep P type layer, an ion-implanting energy needs to be increased. Generally, the area of an impurity region formed by increased ion-implanting energy increases. That is, the area of the overflow-drain region will increase. Therefore, there is a tradeoff relationship between a higher quality picture and miniaturization, and there is also a problem in that a solid state imaging device cannot be miniaturized if the N layer is deepened for achieving higher quality picture.

The present invention has been made in view of the above described problems, and is intended to provide a solid state imaging device and a method of driving the same which can attain, without damaging the design flexibility, a higher quality picture and miniaturization while speeding up the frame rate by allowing the accumulating period and the reading period to be set to a common timing.

SUMMARY

A solid state imaging device according to the present invention includes: a substrate; a photoelectric conversion element, formed in the substrate and that generates photo-generated electric charges corresponding to incident light; an accumulation well that accumulates the photo-generated electric charges; a modulation well that stores the photo-generated electric charges transferred from the accumulation well; a modulation transistor whose channel threshold voltage is controlled by the photo-generated electric charges stored in the modulation well and that outputs a pixel signal corresponding to the photo-generated electric charges; a transfer control element whose control end is commonly coupled to a control end of the modulation transistor and that changes a potential barrier of a transfer channel between the accumulation well and the modulation well, and controls transfer of the photo-generated electric charges; an unwanted electric charge discharging control element that controls the potential barrier of an unwanted electric charge discharging channel coupled to the accumulation well, the unwanted electric charge discharging control element discharging the photo-generated electric charges that overflow from the accumulation well through the unwanted electric charge discharging channel during a period except a transfer period of the photo-generated electric charges from the accumulation well to the modulation well by the transfer control element; and a residual electric charge discharging control element which controls the potential barrier of the residual electric charge discharging channel coupled to the modulation well, and has the residual electric charges in the modulation well discharge through the residual electric charge discharging channel.

According to the embodiment of the present invention, photo-generated electric charges generated by the photoelectric conversion element are accumulated in the accumulation well. The photo-generated electric charges accumulated in the accumulation well are transferred to the modulation well through the transfer channel. The channel threshold voltage of the modulation transistor is controlled by the photo-generated electric charges stored in the modulation well, and the pixel signal corresponding to the photo-generated electric charges is outputted from the modulation transistor. The transfer control element can control transfer of the photo-generated electric charges by changing the potential barrier of the transfer channel. Moreover, the unwanted electric charge discharging control element controls the potential barrier of the unwanted electric charge discharging channel coupled to the accumulation well, and discharges the electric charges that overflow from the accumulation well through the unwanted electric charge discharging channel during the period other than the transfer period of the photo-generated electric charges from the accumulation well to the modulation well by the transfer control element. Furthermore, the residual electric charge discharging control element controls the potential barrier of the residual electric charge discharging channel coupled to the modulation well, and discharges the residual electric charges in the modulation well through the residual electric charge discharging channel. Accordingly, in the reading period of the pixel signal from the modulation transistor, the photo-generated electric charges can be accumulated in the accumulation well while transfer of the photo-generated electric charges from the accumulation well to the modulation well is prevented. Moreover, the electric charges, which are generated in the accumulation well and overflow when a strong light is entered or the like, are discharged to the outside through the unwanted electric charge discharging channel. Thus, even if the reading period and an accumulating period are set to a common timing, secured accumulation and reading can be attained. Furthermore, the control end of the modulation transistor and the control end of the transfer control element are commonly coupled, and the modulation transistor and the transfer control element are controlled in common by a signal from the common drive circuit through a wiring coupled to these control ends. Accordingly, the wiring and the drive circuits coupled to the modulation transistor and the transfer control element can be reduced, and the flexibility of the cell layout can be improved.

Moreover, the residual electric charge discharging control element, during a period except the transfer period of the photo-generated electric charges from the accumulation well to the modulation well by the transfer control element, discharges the electric charges that overflow from the modulation well through the residual electric charge discharging channel.

According to the embodiment of the present invention, the electric charges that overflow from the modulation well are also discharged outside through the residual electric charge discharging channel without flowing to the accumulation well. Accordingly, even if the reading period and the accumulating period are set to a common time, secured accumulation and secure reading can be carried out.

Moreover, the unwanted electric charge discharging control element determines the accumulating period of the photo-generated electric charges in the accumulation well by discharging the photo-generated electric charges accumulated in the accumulation well, at a predetermined timing.

According to the embodiment of the present invention, the photo-generated electric charges are securely accumulated in the accumulation well by controlling the potential barrier of the transfer channel and the unwanted electric charge discharging channel. By discharging the photo-generated electric charges accumulated in the accumulation well at a predetermined timing, the accumulation of the photo-generated electric charges in the accumulation well is initiated from this discharging timing. An accumulation of the photo-generated electric charges is completed by transferring the photo-generated electric charges accumulated in the accumulation well to the modulation well through the transfer channel in the transfer period. Thus, by discharging the photo-generated electric charges through the unwanted electric charge discharging channel, the accumulating period can be set without restraint, thereby enabling imaging not only in a normal mode but in a high-speed shutter mode and in a low-speed shutter mode.

Moreover, the residual electric charge discharging channel is formed in the substrate lateral direction.

According to the embodiment of the present invention, the residual electric charges remaining in the modulation well are discharged through the residual electric charge discharging channel formed in the substrate lateral direction. Accordingly, in the modulation transistor formation region, it is not necessary to form, in the substrate depth direction, a discharge channel for the residual electric charges, and the flexibility on the impurity design in the modulation transistor formation region can be improved.

The residual electric charge discharging channel and the unwanted electric charge discharging channel are coupled to external wiring through a terminal on the substrate.

According to the embodiment of the present invention, the electric charges accumulated in the accumulation well are discharged from the unwanted electric charge discharging channel to the external wiring through the terminal on the substrate, and the electric charges accumulated in the modulation well are discharged from the residual electric charge discharging channel to the external wiring through the terminal on the substrate. Therefore, it is not necessary to form a discharging channel by a diffusion layer in the depth direction of the substrate in the substrate. Accordingly, even if the depth direction of the substrate in a photoelectric conversion element formation region is deepened for attaining a higher quality picture, a deep discharging channel is not needed, therefore, it is not necessary to make the discharging channel a large area in terms of the cell layout, and the miniaturization can be attained.

A method of driving a solid state imaging device according to the present invention comprises: the accumulation well that accumulates the photo-generated electric charges generated by the photoelectric conversion element corresponding to incident light; the modulation well that controls a threshold voltage of a channel of the modulation transistor by storing the photo-generated electric charges; the transfer control element whose control end is commonly coupled to a control end of the modulation transistor and that controls the potential barrier of the transfer channel between the accumulation well and the modulation well; the unwanted electric charge discharging control element that controls the potential barrier of the unwanted electric charge discharging channel coupled to the accumulation well, and the residual electric charge discharging control element that controls the potential barrier of the residual electric charge discharging channel coupled to the modulation well, the method, further comprises: a single accumulation step of controlling the potential barrier of the transfer channel and the unwanted electric charge discharging channel by the transfer control element and the unwanted electric charge discharging control element, and accumulating the photo-generated electric charges by the photoelectric conversion element into the accumulation well so that the photo-generated electric charges may not flow to the modulation well at least through the transfer channel; a reading step, comprising: a signal component modulation step of controlling the potential barrier of the residual electric charge discharging channel and the transfer channel by the residual electric charge discharging control element and the transfer control element, and outputting the pixel signal corresponding to the photo-generated electric charges from the modulation transistor, while having the modulation well store the photo-generated electric charges; a discharging step of controlling the potential barrier of the residual electric charge discharging channel by the residual electric charge discharging control element, and the discharging residual electric charges of the modulation well through the residual electric charge discharging channel; and a noise component modulation step of controlling the potential barrier of the residual electric charge discharging channel and the transfer channel by the residual electric charge discharging control element and the transfer control element, and reading the noise component from the modulation transistor after the discharging step; a parallel accumulation step of controlling the potential barrier of the transfer channel and the unwanted electric charge discharging channel by the transfer control element and the unwanted electric charge discharging control element, and accumulating the photo-generated electric charges by the photoelectric conversion element into the accumulation well so that the photo-generated electric charges may not flow to the modulation well at least through the transfer channel during the same period as the signal component modulation step, the discharging step, and the noise component modulation step; and a transfer step of controlling the potential barrier of the transfer channel by the transfer control element, and transferring and storing the photo-generated electric charges accumulated in the accumulation well to the modulation well.

According to the embodiment of the present invention, the photo-generated electric charges generated by the photoelectric conversion element are accumulated in the accumulation well in the single accumulation step, at least without flowing into the modulation well side. Moreover, the parallel accumulation step is carried out in the same period as the reading step including the signal component modulation step of outputting the pixel signal corresponding to the photo-generated electric charges from the modulation transistor, the discharging step of discharging the residual electric charges in the modulation well, through the residual electric discharging channel, and the noise component modulation step of reading a noise component from the modulation transistor after the discharging step. Accordingly, photo-generated electric charges by the photoelectric conversion element will be accumulated in the accumulation well, without flowing into the modulation well at least through the transfer channel. The photo-generated electric charges accumulated in the accumulation well in the single accumulation step and the parallel accumulation step are transferred and stored to the modulation well in the transfer step. The reading corresponding to the photo-generated electric charges stored in the modulation well is carried out in the reading step. During the reading period in the reading step, accumulation of the photo-generated electric charges is carried out simultaneously, thereby enabling speeding up of the frame rate. Moreover, the control of the modulation transistor and the transfer control element can be controlled by the common drive circuit which provides a signal to these control terminals, thereby enabling the reduction of the vertical drive circuit block. Moreover, the number of wiring in terms of the cell layout can be reduced, therefore miniaturization of the unit pixel, or higher sensitivity by expanding the light-receiving element region will be easily realized.

The transfer step is carried out after the single accumulation step, the reading step and the parallel accumulation step carried out in the same period are repeated a number of times based on the number of lines per one screen.

According to the embodiment of the present invention, the accumulation operation in the single accumulation step and the parallel accumulation step are carried out at the same time of reading all lines that is carried out from the transfer step to the following transfer step. Accumulation in one screen period except the transfer period can be carried out.

Moreover, the method further includes an initialization step of controlling the potential barrier of the transfer channel and the unwanted electric charge discharging channel by the transfer control element and the unwanted electric charge discharging control element during an arbitrary period within one screen period, and discharging the photo-generated electric charges, which are accumulated in the accumulation well, through the unwanted electric charge discharging channel, wherein the transfer step is carried out, after the single accumulation step, the reading step and the parallel accumulation step that are carried out in the same period are repeated a number of times based on the number of lines per one screen and the timing within one screen period in the initialization step.

According to the embodiment of the present invention, by discharging the photo-generated electric charges accumulated in the accumulation well in an arbitrary period within one screen period, the accumulation of the photo-generated electric charges of the accumulation well is initiated from the completion timing of this arbitrary period. The accumulation of the photo-generated electric charges is completed upon the photo-generated electric charges accumulated in the accumulation well being transferred to the modulation well through the transfer channel. Thus, corresponding to the timing of discharging the photo-generated electric charges through the unwanted electric charge discharging channel, the accumulating period can be set without restraint, and imaging not only in the normal mode but in the high-speed shutter mode and in the low-speed shutter mode can be attained.

Moreover, the method includes the high-speed shutter mode wherein the period from the initialization step to the transfer step is shorter than one screen period.

According to the embodiment of the present invention, the accumulating period can be shortened, and even if an extremely bright light is entered, an entire picture can be prevented from becoming whitish (washed out) to degrade the contrast thereof.

Moreover, the method includes the low-speed shutter mode wherein the period from the initialization step to the transfer step is longer than one screen period.

According to the embodiment of the present invention, the accumulating period can be increased, and even if incident light is extremely dark, a picture with sufficient brightness can be obtained.

BRIEF DESCRIPTION OF THE DRAWINGS

Figures 7A, 7B, 7C, 7D, 7E:
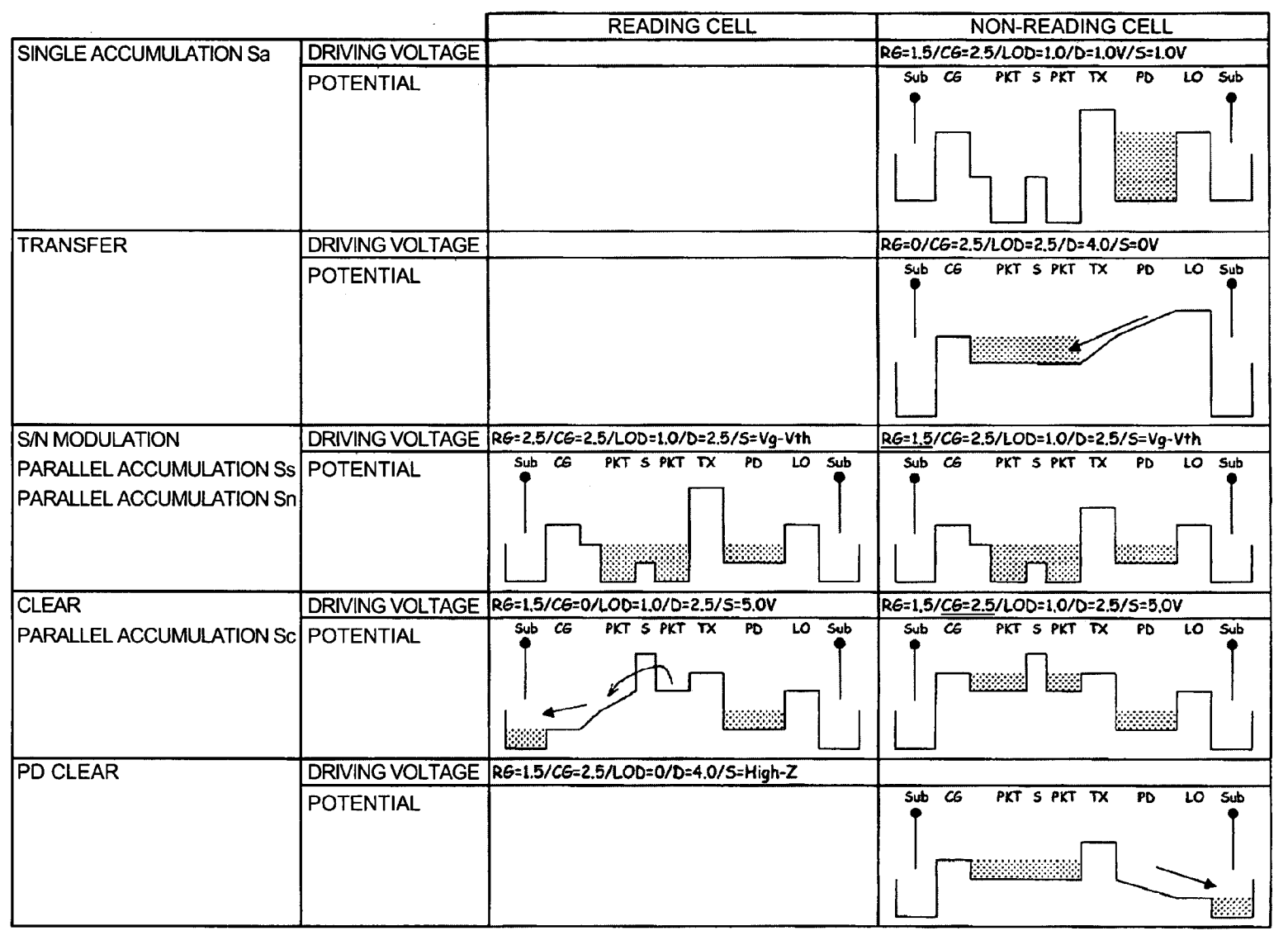

FIG. 7A through 7E are diagrams showing the potential relationship for each period.

FIGS. 10A and 10B are timing charts showing the driving sequence.

FIG. 20 is a timing chart showing the driving sequence of the second embodiment.

DETAILED DESCRIPTION

Figure 1:
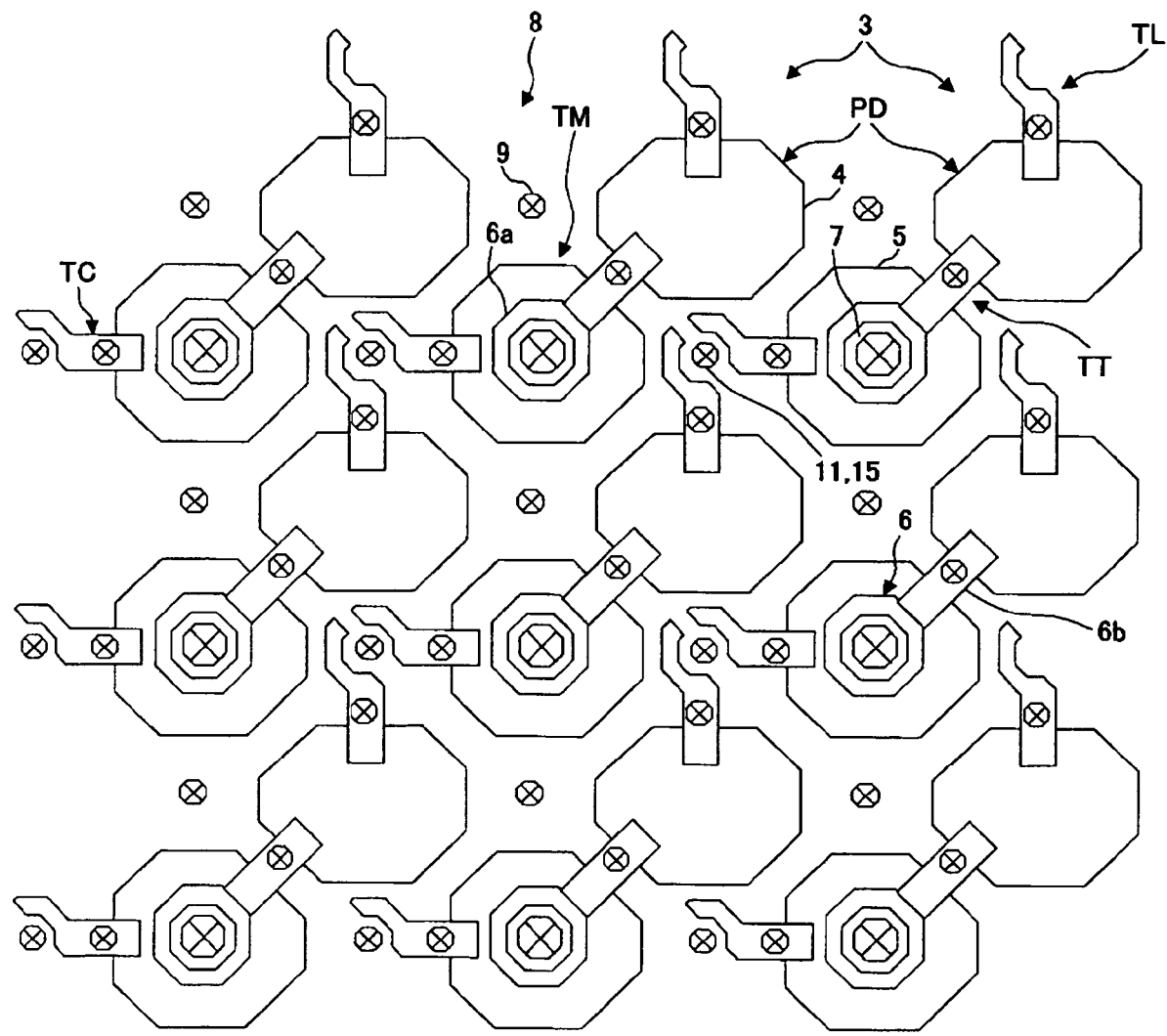
FIG. 1 is a plan view showing the planar shape of a solid state imaging device of a first embodiment of the present invention.
Figure 2:
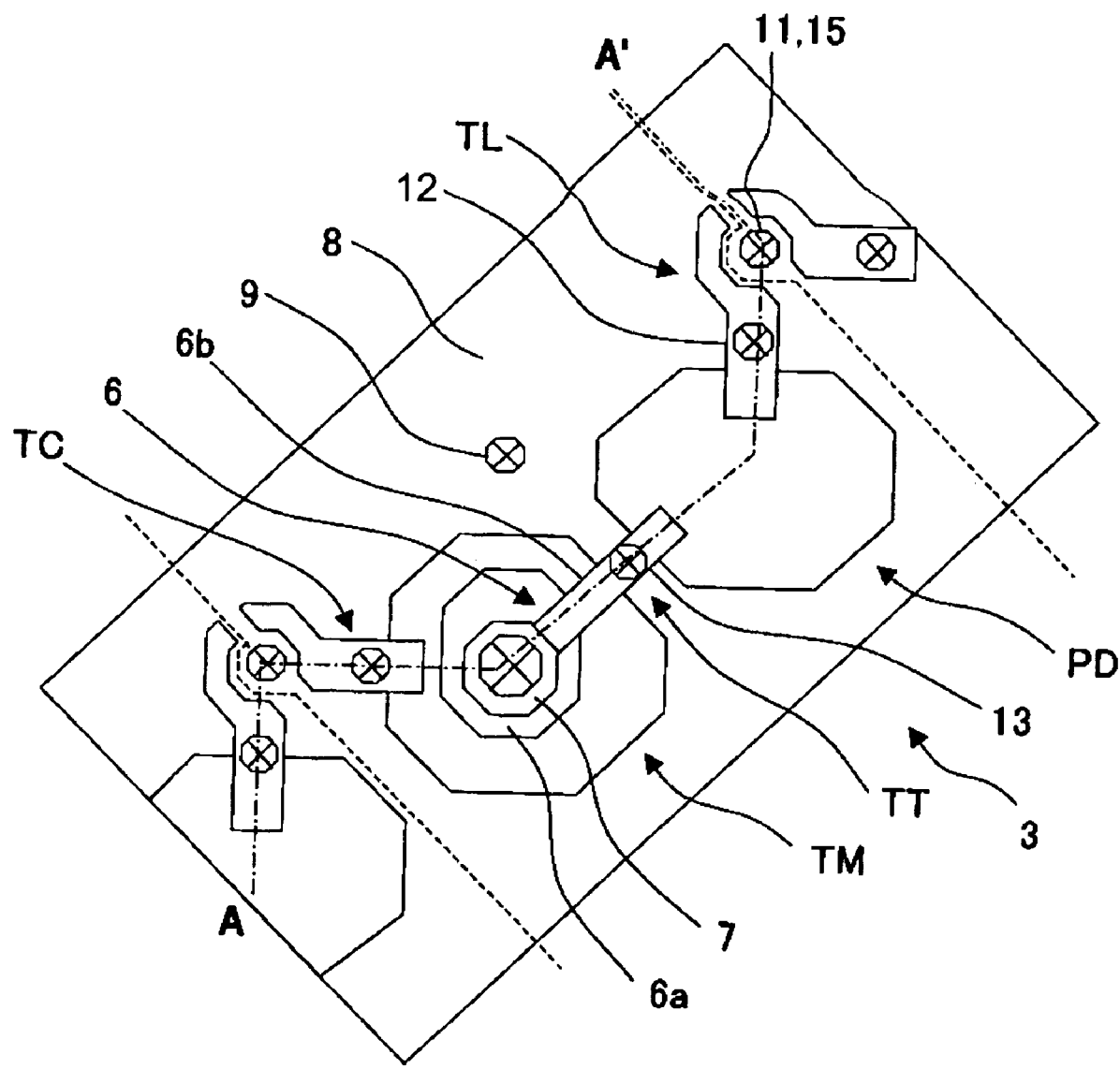
FIG. 2 is a plan view showing the planar shape of one cell of FIG. 1.
Figure 3:
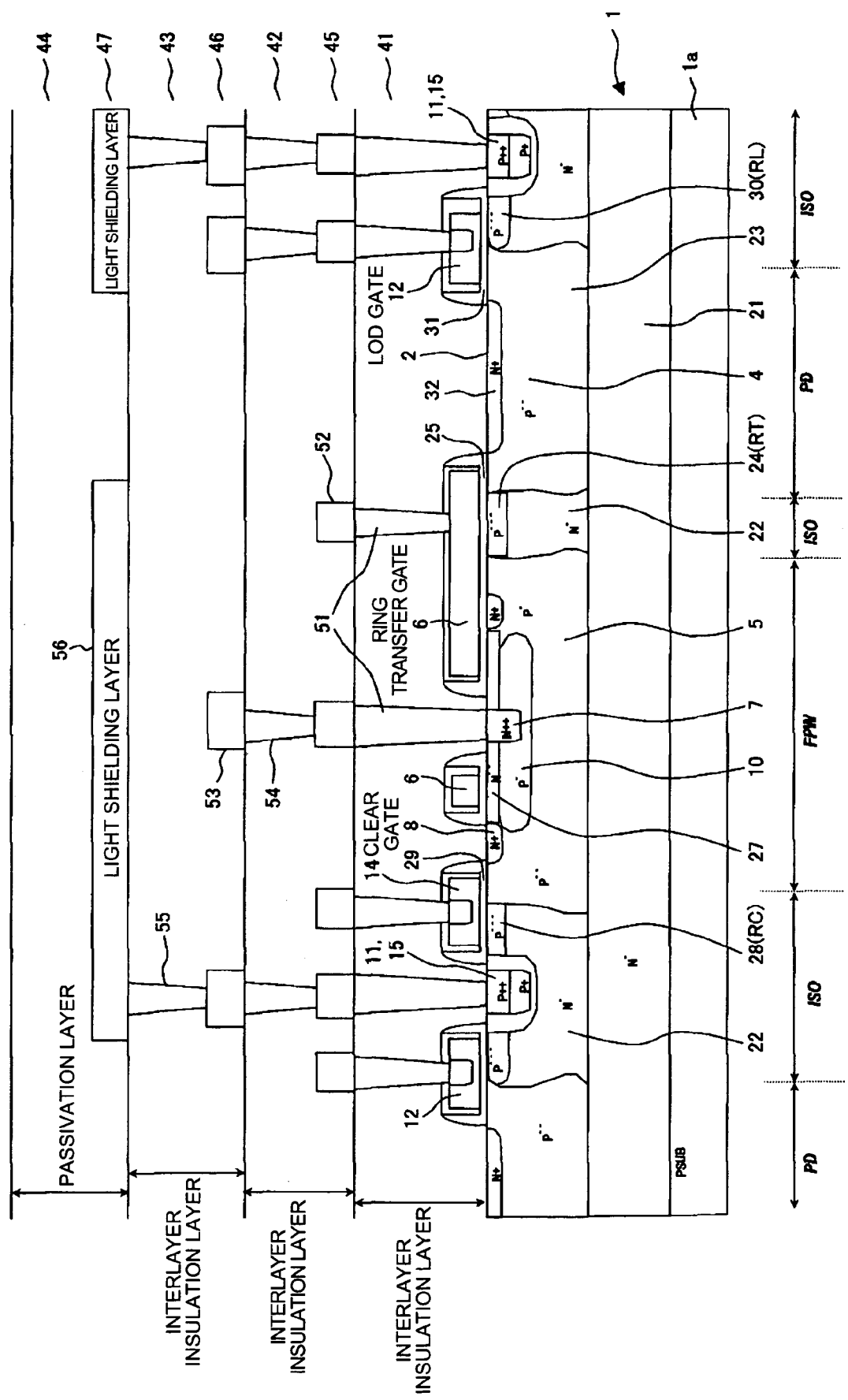
FIG. 3 is a sectional view showing the cross-section cut along the A–A' line of FIG. 2.
Figure 4:
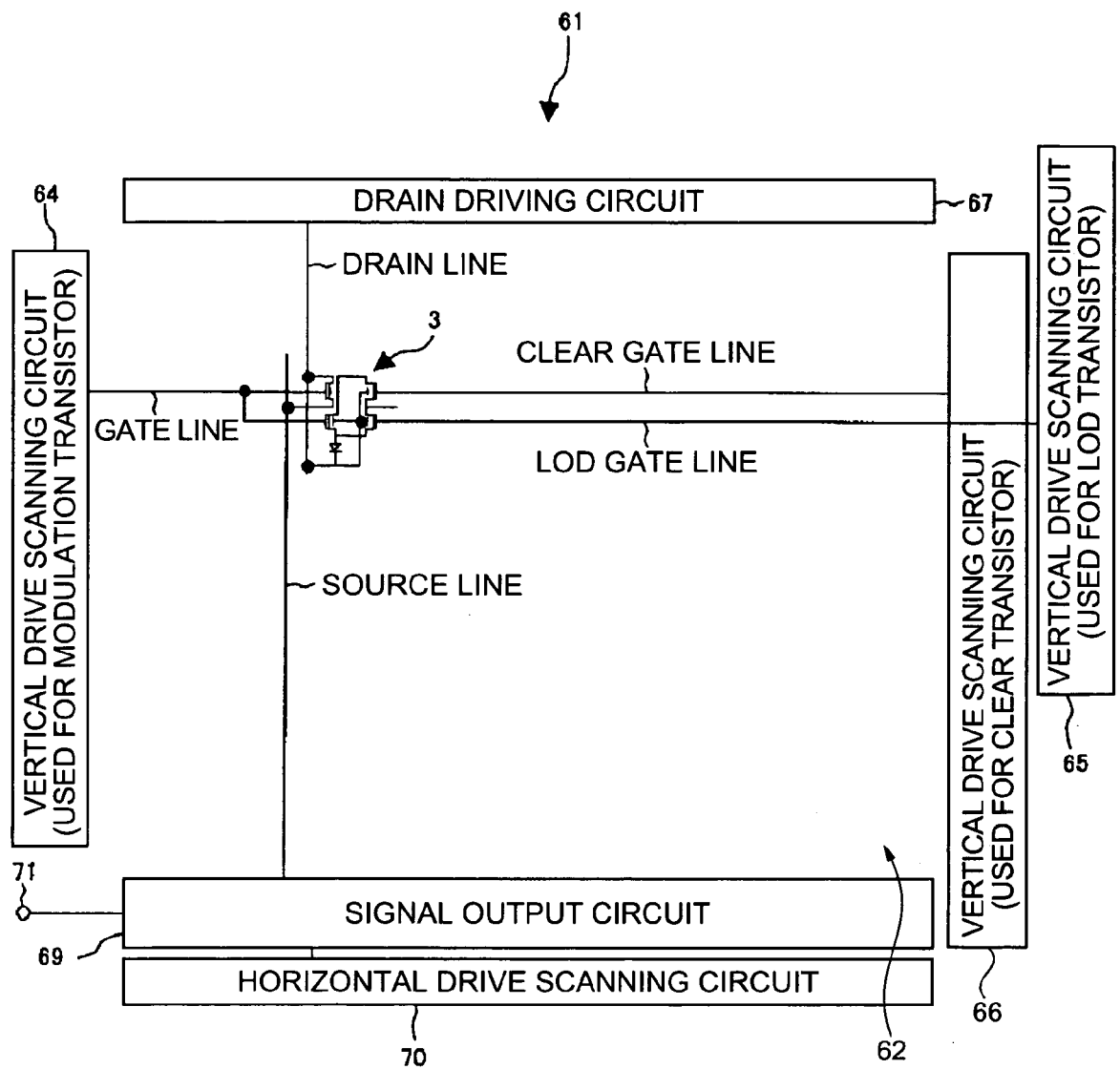
FIG. 4 is a block diagram showing the entire structure of the element.
Figure 8:
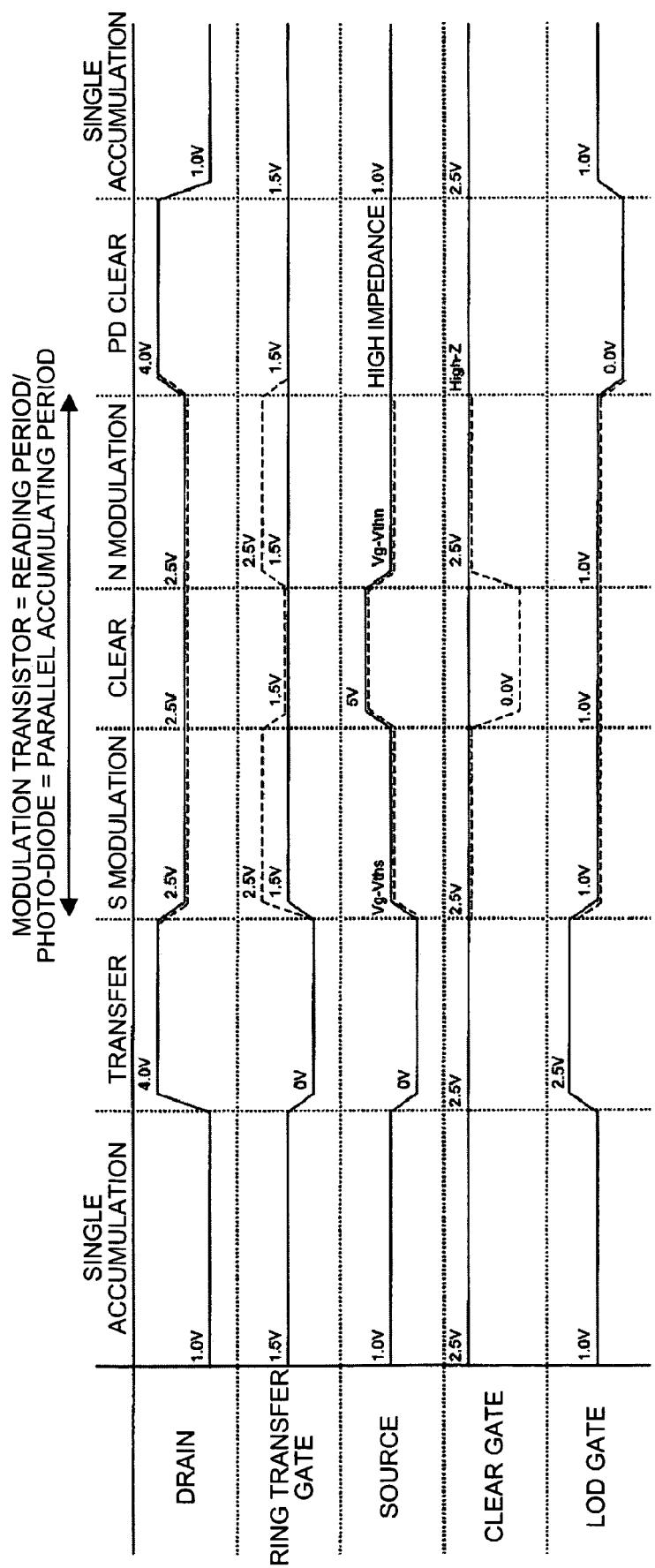
FIG. 8 is a diagram showing changes of the driving voltage in each period in the driving sequence.
Figure 9:
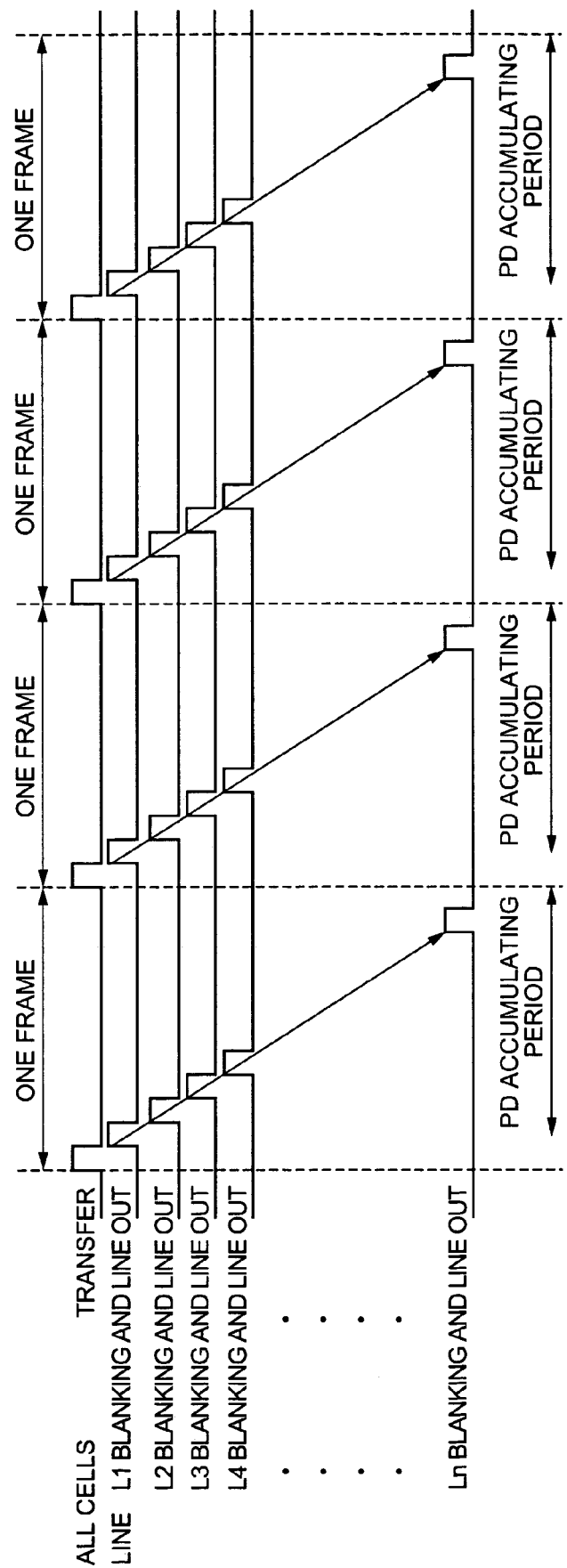
FIG. 9 is a timing chart showing a driving sequence.

Hereinafter, embodiments of the present invention will now be described in detail with reference to the accompanying drawings. FIG. 1 through FIG. 13 are related to a first embodiment of the present invention, and FIG. 1 is a plan view showing a planar shape of a solid state imaging device of the embodiment, FIG. 2 is a plan view showing a planar shape of one cell of FIG. 1, and FIG. 3 is a cross-sectional view showing a cross-section cut along the A–A' line of FIG. 2. FIG. 4 is a block diagram showing the entire structure of the element, and FIG. 5 is an equivalent circuit diagram of a sensor cell. FIG. 6 is a timing chart for illustrating the outline of each driving period in the embodiment. FIG. 7 is a diagram showing potential relationship for the same period of each section, and FIG. 8 is a diagram showing changes of the driving voltage for each period in the driving sequence. FIG. 9 and FIG. 10 are timing charts showing driving sequences. FIG. 11 through FIG. 13 are process flowcharts for explaining the method of manufacturing the element.

The solid state imaging device of the present embodiment includes the photoelectric conversion element, the accumulation well, the modulation well, and the modulation transistor. In the present embodiment, the photoelectric conversion element is a photo-diode. The accumulation well is provided in the photoelectric conversion element formation region, and accumulates electric charges (hereinafter, referred to as photo-generated electric charges) generated by the photoelectric conversion element. The modulation well is provided in the modulation transistor formation region, and stores the photo-generated electric charges transferred from the accumulation well. The threshold of the modulation transistor is modulated by the photo-generated electric charges stored in the modulation well, based on which the modulation transistor outputs the pixel signal.

Moreover, the solid state imaging device of the present embodiment includes a photo-generated electric charge transfer channel and the transfer control element. The photo-generated electric charge transfer channel is provided between the accumulation well and the modulation well. The photo-generated electric charges are transferred from the accumulation well to the modulation well through the photo-generated electric charge transfer channel. The transfer control element controls the potential barrier of the photo-generated electric charge transfer channel, and moves the photo-generated electric charges to the modulation well from the accumulation well. In the present embodiment, the transfer control element is a transfer transistor. The accumulation well and the modulation well are independently separated in terms of potential by the transfer control element. Accordingly, the accumulating period and the reading period (hereinafter, referred to as a blanking period) can be set within the same period, and consequently the frame rate can be enhanced.

Furthermore, the solid state imaging device of the present embodiment includes the residual electric charge discharging channel, a contact region for discharging residual electric charges, and a residual electric charge discharging control element. The residual electric charge discharging channel is provided between the modulation well and the contact region for discharging residual electric charges, and provided approximately horizontally along the substrate surface. The residual electric charge discharging channel is electrically coupled to a wiring layer provided on the substrate through the contact region for discharging residual electric charges. Electric charges remaining in the modulation well (hereinafter, referred to as residual electric charges) are transferred to the contact region for discharging residual electric charges from the modulation well through the residual electric charge discharging channel. The contact region for discharging residual electric charges is formed inside the residual electric charge discharging channel. The residual electric charge discharging control element controls the potential barrier of the residual electric charge discharging channel, and discharges the residual electric charge from the modulation well to the wiring layer. In the present embodiment, the residual electric charge discharging control element is a clear transistor. The residual electric charges are not directly discharged vertically downward to the substrate from the modulation well. That is, the residual electric charges are displaced approximately horizontally along the substrate surface, namely in the substrate lateral direction, and are then discharged to the wiring layer formed on the substrate. Accordingly, the flexibility in an impurity profile design of the modulation transistor formation region can be improved.

Furthermore, the solid state imaging device of the present embodiment includes the unwanted electric charge discharging channel, a contact region for discharging unwanted electric charges, and the unwanted electric charge discharging control element. The unwanted electric charge discharging channel is provided between the accumulation well and the contact region for discharging the unwanted electric charges, and provided approximately horizontally along the substrate surface. The unwanted electric charge discharging channel is electrically coupled to a wiring layer provided on the substrate through the contact region for discharging unwanted electric charges. Electric charges that are unnecessary (hereinafter, referred to as unwanted electric charges) which overflows from the accumulation well without being accumulated in the accumulation well and does not contribute to the picture signal, are transferred to the contact region for discharging the unwanted electric charges from the accumulation well through the unwanted electric charge discharging channel. The contact region for discharging the unwanted electric charges is formed inside the unwanted electric charge discharging channel. The unwanted electric charge discharging control element controls the potential barrier of the unwanted electric charge discharging channel, and discharges unwanted electric charges from the accumulation well to the wiring layer. In the present embodiment, the unwanted electric charge discharging control element is a lateral-overflow-drain (hereinafter, referred to as LOD) transistor. Unwanted electric charges are not directly discharged perpendicularly downward of the substrate from either one of the accumulation well and the contact region for discharging unwanted electric charges. That is, the unwanted electric charges are displaced approximately horizontally along the substrate surface, namely in the substrate lateral direction, and are then discharged to the wiring layer formed on the substrate. Accordingly, miniaturization can be attained, even if the depth of the impurity layer in the photoelectric conversion element formation region is deepened to attain higher quality picture.

Furthermore, in the present embodiment, the gates of the modulation transistor TM and the transfer transistor TT are integrated, and thereby the number of wiring coupled the gates of transistors TM and TT can be reduced, and the drive circuit for driving transistors TM and TT can be omitted. Accordingly, it is extremely advantageous in terms of the cell layout.

Structure of Sensor Cell

The solid state imaging device according to the present embodiment has a sensor cell array constituted arranging sensor cells, which are unit pixels, in a matrix form, as will be described later. Each sensor cell accumulates photo-generated electric charges generated corresponding to incident light, and outputs a pixel signal with a level based on the accumulated photo-generated electric charges. The picture signal of one screen is obtained by arranging the sensor cells in a matrix form.

First, the structure of each sensor cell will be described with reference to FIG. 1 through FIG. 3. FIG. 1 shows the sensor cell with 3 horizontal pixels×3 perpendicular pixels, and FIG. 2 shows one sensor cell. In addition, one sensor cell is a region shown with the dashed lines of FIG. 2. In addition, the present embodiment shows an example using holes as the photo-generated electric charges. In the case of using electrons as the photo-generated electric charges, the same can be constructed. Moreover, FIG. 3 shows a cross-sectional structure of the cell cut along the A–A' line of FIG. 2.

As shown in the plan views of FIG. 1 and FIG. 2, a photo-diode PD and the modulation transistor TM are adjacently formed in a sensor cell 3 which is a unit pixel. As for the modulation transistor TM, an N channel depletion MOS transistor is used, for example. The unit pixel has an almost rectangular shape, each side of which is inclined to the row or line direction of the sensor cell array.

In a photo-diode PD formation region (PD of FIG. 3), an opening region 2 is formed on the surface of a substrate 1, and an accumulation well 4, which is a P type well with a region wider than the opening region 2, is formed in the relatively shallow position of the substrate 1 surface. A modulation well 5 which is a P type well is formed in a modulation transistor TM formation region (FPW of FIG. 3) with a predetermined space apart from this accumulation well 4.

On the modulation well 5, a ring-shaped portion (hereinafter, referred to as ring gate portion) 6a of the gate (ring transfer gate) 6, whose one end is ring-shaped and whose other end is line-shaped, is formed in the substrate 1 surface, and a source region 7 which is a high concentration N type region is formed in the region near the substrate 1 surface of the center opening portion of the ring gate portion 6a. An N type drain region 8 is formed in the surroundings of the ring gate portion 6a. A drain contact region 9 of an N$^+$ layer is formed in a predetermined position of a drain region 8, near the substrate 1 surface.

The modulation well 5 controls the threshold voltage of the channel of the modulation transistor TM. In the modulation well 5, a carrier pocket 10 (FIG. 3) which is a P type high concentration region is formed under the ring gate portion 6a. The modulation transistor TM is constituted by the modulation well 5, the ring gate portion 6a, the source region 7, and the drain region 8, and the threshold voltage of the channel changes corresponding to the electric charges accumulated in the modulation well 5 (carrier pocket 10).

A depletion region (not shown) is formed in the boundary region of an N type well 21, which will be described later, and a P type accumulation well 4 which are formed on the substrate 1 under the opening region 2 of the photo-diode PD, and photo-generated electric charges generated by incident light through the opening region 2 are generated in this depletion region. In the present embodiment, the photo-generated electric charges generated are accumulated in the accumulation well 4.

The electric charges accumulated in the accumulation well 4 are transferred to the modulation well 5, and are stored in the carrier pocket 10. Accordingly, the source potential of the modulation transistor TM becomes the one corresponding to the amount of the electric charges transferred to the modulation well 5, i.e., to the incident light upon the photo-diode PD.

A contact region 11 for discharging unwanted electric charges (hereinafter, referred to as OD contact region), including electric charges that overflow, is formed by a high concentration P type diffusion layer in the substrate 1 surface near the accumulation well 4. On the substrate 1 surface between this OD contact region 11 and the accumulation well 4 region, an LOD gate 12 of an LOD transistor TL for forming a channel RL for the unwanted electric charges (hereinafter, referred to as unwanted electric charge discharging channel) including the electric charges that overflow between the OD contact region 11 and the accumulation well 4 region is formed. In addition, one end of the LOD gate two-dimensionally hangs over the accumulation well 4 region.

In the present embodiment, the transfer transistor TT is formed between the accumulation well 4 and the modulation well 5. The gate of the transfer transistor TT is constituted by a straight line-shaped portion (hereinafter, referred to as transfer gate portion) 6b of the ring transfer gate 6. The transfer gate portion 6b is formed on the substrate 1 surface of the channel RT between the accumulation well 4 and the modulation well 5 (hereinafter, simply referred to as transfer channel). The electric charge transfer from the accumulation well 4 to the modulation well 5 can be controlled by controlling the potential barrier of the transfer channel RT by the transfer transistor TT.

Thus, in the present embodiment, the ring gate portion 6a constituting the modulation transistor TM and the transfer transistor TT, and the transfer gate portion 6b are integrally formed, and by applying a driving voltage to the ring transfer gate 6, the modulation transistor TM and the transfer transistor TT are simultaneously controlled.

Moreover, in the present embodiment, in the substrate surface near the modulation well 5, a contact region 15 for discharging by a high concentration P type diffusion layer (hereinafter, referred to as discharging contact region) is formed. On the substrate 1 surface between this discharging contact region 15 and the modulation well 5 region, a clear gate 14 of a clear transistor TC for controlling the potential barrier of the channel RC between the discharging contact region 15 and the modulation well 5 region (hereinafter, referred to as residual electric charge discharging channel) is formed. In addition, one end of the clear gate 14 two-dimensionally hangs over the modulation well 5 region.

Cross-Section of Sensor Cell

Furthermore, with reference to FIG. 3, the cross-sectional structure of the sensor cell 3 will be described in detail. Incidentally, the subscripts, "−" and "+", of N and P in FIG. 3 indicate the state of a portion from a lighter impurity concentration (subscript $^{---}$) to a heavier impurity concentration (subscript $^{+++}$), depending on the number of the subscript.

FIG. 3 shows one unit pixel (cell) and the photo-diode PD formation region (PD) of a pixel adjacent to this cell. One cell has the photo-diode PD formation region (PD) and the modulation transistor TM formation region (FPW). An isolation region (ISO) is provided between the photo-diode PD formation region and the modulation transistor TM formation region within a cell and between adjacent cells.

At a relatively deep position of the substrate 1, the N type well 21 of N$^-$ is formed in the entire P type substrate 1a. An isolation region 22 used for isolating elements by an N$^-$ layer is formed on this N type well 21. On the N type well 21, a P$^{--}$ layer 23 is formed across the entire element except the isolation region 22.

The P$^{--}$ layer 23 in the photo-diode PD formation region functions as the accumulation well 4. The P$^{--}$ layer 23 in the modulation transistor TM formation region functions as the modulation well 5, and in this modulation well 5, the carrier pocket 10 is formed by a P-diffusion.

In the isolation region 22 between the photo-diode PD formation region and the modulation transistor TM formation region in the cell, the transfer transistor TT is formed at the substrate surface side. The transfer transistor TT is constituted by forming a P$^{---}$ diffusion layer 24, which constitutes a channel on the substrate surface, and the transfer gate portion 6b on the substrate surface through a gate insulating layer 25. This P$^{---}$ diffusion layer 24, being coupled to the accumulation well 4 and the modulation well 5 to constitute the transfer channel RT, and the potential barrier of this transfer channel RT is controlled corresponding to the applied voltage to the transfer gate portion 6b.

In the modulation transistor TM formation region, the ring gate portion 6a is formed in the substrate surface through a gate insulating layer 25, and an N$^{--}$ diffusion layer 27 which constitutes a channel is formed in the substrate surface under the ring gate portion 6a. An N$^{++}$ diffusion layer is formed in the substrate surface of the center of the ring gate portion 6a to constitute the source region 7. Moreover, the N$^+$ diffusion layer is formed in the substrate surface in the periphery of the ring gate portion 6a to constitute the drain region 8. The N$^{--}$ diffusion layer 27 which constitutes a channel is coupled to the source region 7 and the drain region 8.

In the isolation region 22 between the photo-diode PD formation regions and the modulation transistor TM formation regions of adjacent cells, a discharging contact region 15 and an OD contact region 11 are formed, at the substrate surface side. In the present embodiment, these discharging contact region 15 and the OD contact region 11 are combined to be used, however, may be constituted separately. The discharging and OD contact regions 15, 11 are obtained by forming a P$^{++}$ diffusion layer in the substrate surface.

Then, at the substrate surface side between the modulation transistor TM formation region, and the discharging and OD contact regions 15 and 11, a clear transistor TC is formed. The clear transistor TC is constituted by forming a P$^{---}$ diffusion layer 28 which constitutes a channel in the substrate surface between the modulation transistor TM formation region, and the discharging and OD contact regions 15 and 11, and by forming the clear gate 14 in the substrate surface through a gate insulating layer 29. This P$^{---}$ diffusion layer 28, being coupled to the modulation well 5 and the discharging and OD contact regions 15 and 11 to constitute the residual electric charge discharging channel RC, and the potential barrier of this residual electric charge discharging channel RC is controlled corresponding to the applied voltage to the clear gate 14.

At the substrate surface side between the photo-diode PD formation region and the discharging and OD contact regions 15 and 11, the LOD transistor TL is formed. The LOD transistor TL is constituted by forming a P$^{---}$ diffusion layer 30 which constitutes a channel in the substrate surface between the photo-diode PD formation region, and the discharging and OD contact regions 15 and 11, and by forming the LOD gate 12 through a gate insulating layer 31 in the substrate surface. This P$^{---}$ diffusion layer 30, being coupled to the accumulation well 4 and the discharging and OD contact regions 15 and 11 to constitute the unwanted electric charge discharging channel RL, and the potential barrier of this unwanted electric charge discharging channel RL is controlled corresponding to the applied voltage to the LOD gate 12.

In addition, at the substrate surface side of the photo-diode PD formation region, an N$^+$ diffusion layer 32 is formed.

A lower-layer wiring layer 45 is formed in the substrate surface through an interlayer insulation layer 41, and an upper-layer wiring layer 46 is formed through an interlayer insulation layer 42 on the lower-layer wiring layer 45. Furthermore, on the upper-layer wiring layer 46, a light shielding layer 47 is formed through an interlayer insulation layer 43, and a passivation layer 44 is formed on the light shielding layer 47. The clear gate 14, the LOD gate 12, the ring transfer gate 6, the discharging and OD contact regions 15 and 11, and the source region 7 are electrically coupled to each wiring 52 of the lower-layer wiring layer 45 through a contact hole 51 opened in the interlayer insulation layer 41. In addition, each of the wirings 52 and 53 of the lower layer and the upper-layer wiring layers 45 and 46 is made of metal material, such as aluminum.

Furthermore, each wiring 52 of the lower-layer wiring layer 45 and each wiring 53 of the upper-layer wiring layer 46 are electrically coupled through a contact hole 54 formed in the interlayer insulation layer 42. Moreover, in the interlayer insulation layer 43, a contact hole 55 for coupling a light shielding layer 56 formed in the light shielding layer 47 and one wiring of the upper-layer wiring layer 46 is opened, and the discharging and OD contact regions 15 and 11 are coupled to the light shielding layer 56 through the lower layer and the upper-layer wiring layers 45 and 46.

In the present embodiment, the transfer transistor TT, the clear transistor TC, and the LOD transistor TL are controlled independently, and then the potential barriers of the transfer channel RT, the residual electric charge discharging channel RC and the unwanted electric charge discharging channel RL are controlled. When describing the ups and downs (rising and lowering) of the potential of these channels, RT, RC and RL with reference to the hole potential, in the accumulating period, the potentials of the transfer channel RT, the residual electric charge discharging channel RC and the unwanted electric charge discharging channel RL are set sufficiently high to allow the photo-generated electric charges (in case of a hole) to be accumulated, while the potentials of the residual electric charge discharging channel RC and the unwanted electric charge discharging channel RL are set lower than the potential of the transfer channel RT. In addition, hereinafter, the ups and downs of the potential will be described with reference to the potential of a hole, not to the potential of an electron.

Effect

By using the sensor cell constituted this way, the accumulating period and the blanking period can be carried out in the same time period.

Comparison with Conventional Example

In the device of the above described Japanese Unexamined Patent Publication No. 2002-134729, under the photo-diode formation region and the ring gate of the modulation transistor, first and a second P type well regions are integrally formed in a planar shape which approximately equals the opening region of the photo-diode and the ring gate. Then, the photo-generated electric charges generated by incident light from the opening region of the photo-diode are transferred from the first well region to the second well region under the ring gate, and are accumulated in the carrier pocket with a low potential (with reference to the hole) formed in this portion.

In such a device of Japanese Unexamined Patent Publication No. 2002-134729, the accumulation and the reading can also be carried out shifting, within one frame period, the line to be initialized using a focal-plane shutter. However, in this case, each cell has a different timing for the accumulating period for each line, and the sampling timing of a picture will deviate in the vertical direction. Therefore, if an object to be imaged moves, picture distortion arises due to the sampling timing offset in the vertical direction of the picture. Especially, in a case that there are many lines provided as per a high resolution requirement, the time deviation will increase between the upper and lower lines and the distortion will be outstanding.

Then, in Japanese Unexamined Patent Publication No. 2002-134729, the accumulating period of all the cells is set to a common period. Namely, during the accumulating period, the potential barrier between the first well region and the second well region integrally formed is lowered by the transfer gate. Accordingly, the photo-generated electric charges are transferred from the first well region to the second well region, and continue to be accumulated in the carrier pocket. Upon completion of the accumulating period, the pixel signal corresponding to the electric charges in the carrier pocket will be outputted in the reading period. In the device of Japanese Unexamined Patent Publication No. 2002-134729, in this reading period, a provision is made to discharge the photo-generated electric charges generated in a light-receiving region to the substrate through an overflow-drain region, thereby enabling the accumulation of only effective photo-generated electric charges in the accumulating period. In addition, in the device of Japanese Unexamined Patent Publication No. 2002-134729, the flexibility in carrying out the impurity profile design that enables such potential that enables such operation is extremely low.

On the other hand, in the present embodiment, the accumulating period and the reading period are set to a common period. Namely, by independently controlling the transfer transistor TT, the clear transistor TC, and the LOD transistor TL, during the accumulating period, the potential barrier of the transfer channel RT, the residual electric charge discharging channel RC, and the unwanted electric charge discharging channel RL is set to a sufficiently high potential. Moreover, during the period other than the transfer period, which will be described later, for example, during the accumulating period, the potentials of the residual electric charge discharging channel RC and the unwanted electric charge discharging channel RL are set lower than the potential of the transfer channel RT. Accordingly, in the accumulating period, transfer of the electric charges between the modulation well 5 and the accumulation well 4 can be prevented, and the photo-generated electric charges can be accumulated in the accumulation well 4. Moreover, before reading the pixel signal, the displacement of the electric charges between the modulation well 5 and the discharging contact region 15 is prevented, and the photo-generated electric charges transferred from the accumulation well 4 can be stored in the modulation well 5.

Thus, during the period before the reading based on the photo-generated electric charges, which are transferred to the modulation well 5 and stored, is completed, even within the accumulating period, the amount of the photo-generated electric charges being stored can be made constant. Therefore, even in the accumulating period, the reading of the pixel signal based on the electric charges stored in the modulation well 5 can be carried out.

Moreover, during the accumulating period, the accumulation well 4 is surrounded, in terms of potential, by the transfer transistor TT and the LOD transistor TL having a sufficiently high potential barrier, the accumulation operation can be carried out even in the reading period of the modulation well 5. Furthermore, even in case that the potential based on the photo-generated electric charges increases remarkably such as the case that an extremely strong light is entered, the photo-generated electric charges flow to the OD contact region 11 side, not to the modulation well 5 side, and will not have an adverse influence on the reading.

Moreover, assuming, even in case that the electric charges in the modulation well 5 overflow, the electric charges that overflow flow to the residual electric charge discharging channel RC side, not to the transfer channel RT side, and thereby increase of the accumulation electric charges due to a reverse flow of the electric charges can be prevented.

Incidentally, in the device of Japanese Unexamined Patent Publication No. 2002-134729, the potential design is carried out so that the photo-generated electric charges generated in a first well region at the photo-diode side may be transferred to a second well region at the modulation transistor side, therefore, as for the discharging channel for the electric charges remaining in the second well, a channel from the second well region to the substrate through an N layer on the substrate can be conceivable. However, as described above, in order to form such discharge channel, it is necessary to precisely control the concentration relationship of each layer, such as the concentration of the carrier pocket and the concentration of the N layer on the substrate in order to control adequately the potential gradient, and moreover, an applied voltage with a wide voltage range should be used, and the design flexibility on the impurity profile will be damaged remarkably, which is not realistic.

On the other hand, in the present embodiment, near the substrate 1 surface, the residual electric charge discharging channel RC by the clear gate 14 is formed, and the residual electric charges in the modulation well are discharged in the lateral direction of the substrate. Accordingly, the design flexibility of the impurity profile in the modulation transistor TM formation region is remarkably high.

Moreover, in the device of Japanese Unexamined Patent Publication No. 2002-134729, because of the necessity of constituting, with a deep P layer extending from the substrate to the substrate surface, the overflow drain region used for the discharging channel at the first well region side, the area for providing the P layer needs to be large in terms of the cell layout, which will be a disincentive for miniaturization. On the other hand, if the P layer is set shallow, the depth of the N layer of the PD needs to be shallow and the light sensitivity to the light with long wavelengths will degrade, therefore it is difficult to realize a higher quality picture. Thus, both higher quality picture and miniaturization have not been achieved satisfactorily.

On the other hand, in the present embodiment, unwanted electric charges including the electric charges that overflow in the accumulation well 4 are transferred to the horizontal direction, and thereafter are discharged from the OD contact region 11 through the wiring on the substrate 1. Moreover, the residual electric charges from the modulation well 5, after having been transferred to the horizontal direction, will be discharged from the discharging contact region 15 through the wiring on the substrate 1. Therefore, it is not necessary to form a deep over-drain region extending from the substrate 1a to the substrate 1 surface, and both a higher quality picture and miniaturization can be achieved satisfactorily.

Circuit Configuration of the Entire Device

Next, the circuit configuration of the entire solid state imaging device according to the present embodiment will be described with reference to FIG. 4.

A solid state imaging device 61 has a sensor cell array 62 including the sensor cell 3 of FIG. 1 through FIG. 3, and circuits 64 through 70 which drive each sensor cell 3 in the sensor cell array 62. The sensor cell array 62 is constituted arranging the cell 3 in a matrix form. The sensor cell array 62 includes, for example, the cell 3 of 640×480, and a region (OB region) for an optical black (OB). When the OB region is included, the sensor cell array 62 is composed of cells 3 of 712×500 or the like.

Equivalent Circuit of Sensor Cell

Figure 5A:
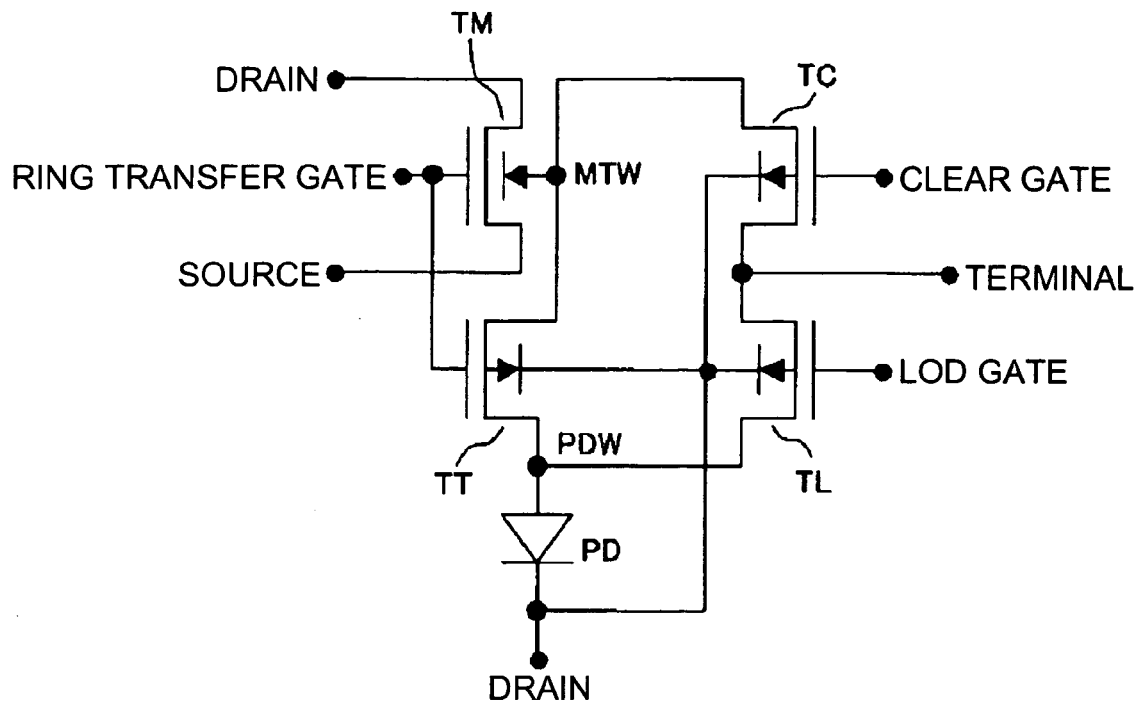
FIGS. 5A and 5B are equivalent circuit diagrams of a sensor cell.
Figure 5B:
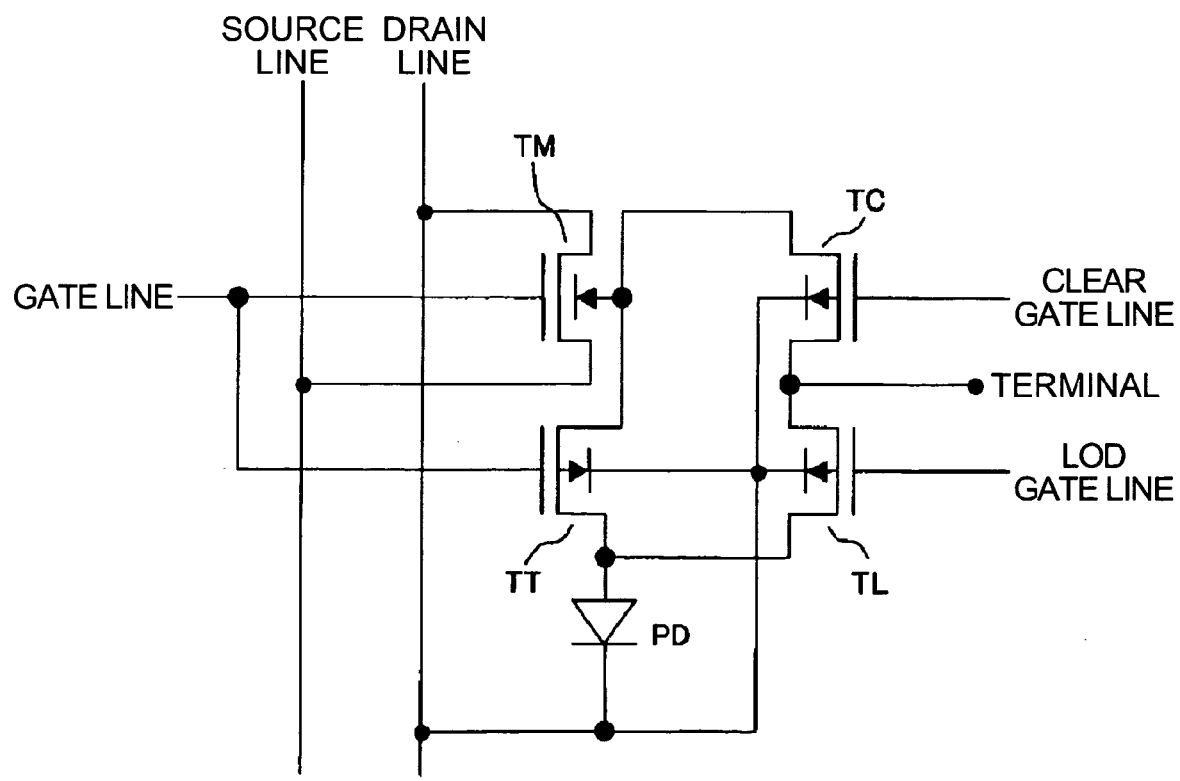
Figure 6:
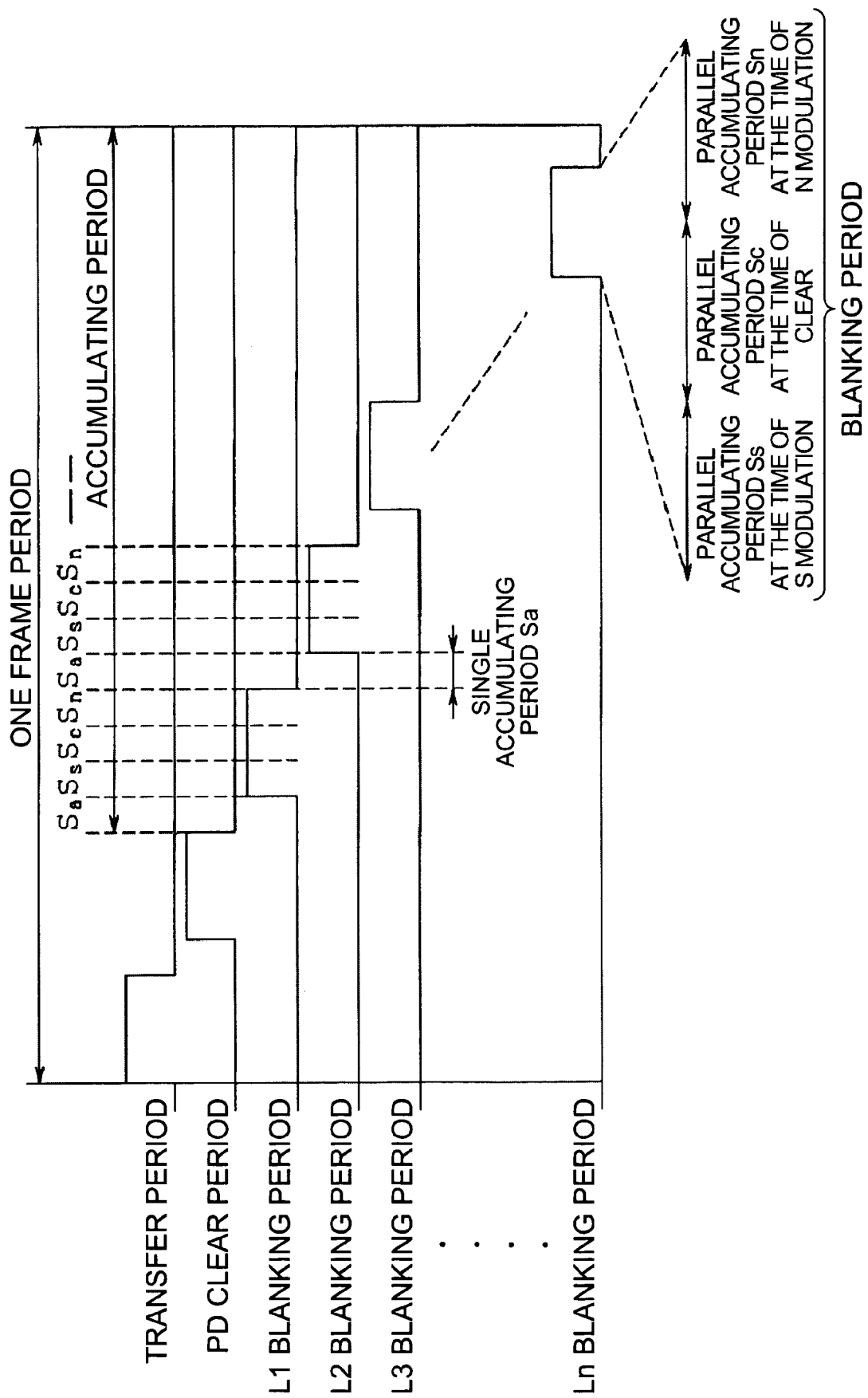
FIG. 6 is a timing chart illustrating the outline of each driving period in the first embodiment.

FIG. 5 shows the specific circuit configuration of each sensor cell of FIG. 4. FIG. 5A shows an equivalent circuit of the sensor cell, and FIG. 5B shows the coupling between the sensor cell and each signal line.

Each sensor cell 3 includes the photo-diode PD which carries out photoelectric conversion, the modulation transistor TM for detecting the optical signal for reading, and the transfer transistor TT which controls transfer of photo-generated electric charges. The photo-diode PD generates electric charges (photo-generated electric charges) corresponding to incident light, and accumulates the generated electric charges to the accumulation well 4 (corresponding to a coupling point PDW in FIG. 5). The transfer transistor TT transfers the photo-generated electric charges accumulated in the accumulation well 4 in the accumulating period to the carrier pocket 10 in the modulation well 5 (corresponding to a coupling point TMW in FIG. 5) used for the threshold modulation of the modulation transistor TM in the transfer period, and stores.

With respect to the modulation transistor TM, that the photo-generated electric charges are stored in the carrier pocket 10 is equivalent to that the back gate bias thereof is changed, and the threshold voltage of the channel changes corresponding to the amount of the electric charges in the carrier pocket 10. Accordingly, the source voltage of the modulation transistor TM becomes the one corresponding to the electric charges in the carrier pocket 10, i.e., the brightness of the incident light upon the photo-diode PD.

Between the modulation well 5 and a terminal, the clear transistor TC as the residual electric charge discharging control element is arranged. The clear transistor TC controls the potential barrier between the modulation well 5 and the terminal, and discharges the electric charge remaining in the modulation well 5 of the cell 3, after completion of the reading of the pixel signal to the terminal. On the other hand, between the accumulation well 4 and the terminal, an LOD transistor TL as the unwanted electric charge discharging control element is arranged. The LOD transistor TL controls the potential barrier between the accumulation well 4 and the terminal, and discharges the unwanted electric charge in the accumulation well 4 to the terminal.

Thus, each cell 3 exhibits the above described operations of the accumulation, the transfer, the reading, discharging or the like by applying driving signal to the ring gate portion 6a, the source and the drain of the modulation transistor TM, the transfer gate 6b of the transfer transistor TT, the clear gate 14 of the clear gate transistor TC and the LOD gate 12 of the LOD transistor TL. In addition, the ring gate portion 6a of the modulation transistor TM and the transfer gate portion 6b of the transfer transistor TT are integrally formed as the ring transfer gate 6. As shown in FIG. 4, the signal is provided to each part of the cell 3 from vertical drive scanning circuits 64 through 66, and a drain drive circuit 67.

FIG. 5B shows, with respect to one of the cell 3 arranged in a matrix form, the coupling to each of the scanning circuits 64 through 66, each of the drive circuits 67, and the signal output circuit 69. The coupling condition of other cells is also the same. Each cell 3 is provided corresponding to the intersection of a plurality of source lines arranged in the horizontal direction and a plurality of gate lines arranged in the vertical direction, with respect to the sensor cell array 62. In each cell 3 of each line arranged in the horizontal direction, the ring transfer gate 6 of the modulation transistor TM is coupled to a common gate line, while in each cell 3 of each row arranged in the vertical direction, the source of the modulation transistor TM is coupled to a common source line.

By providing an ON signal to one of the plurality of gate lines, each cell commonly coupled to the gate line to which the ON signal is provided is simultaneously selected, and the pixel signal is outputted through each source line from each source of these selected cells. The vertical drive scanning circuit 64 provides an ON signal to the gate line by sequentially shifting in one frame period. The pixel signal from each cell of the line to which the ON signal is provided is simultaneously read from the source line by one line portion, and is provided to the signal output circuit 69. The pixel signal for one line portion is sequentially outputted (line-out) for every pixel from the signal output circuit 69 by a horizontal drive scanning circuit 70.

In the present embodiment, as described above, the accumulation well 4 and the modulation well 5 are formed, with being independently separated in terms of the potential, and the transfer transistor TT which controls the potential barrier between the accumulation well 4 and the modulation well 5 is provided. Thus, accumulation of the photo-generated electric charges by the photo-diode PD and the reading of the pixel signal by the modulation transistor TM are carried out simultaneously. Control of the transfer transistor TT is carried out by providing a gate signal to the ring transfer gate 6 of each transfer transistor TT from the vertical drive scanning circuit 64.

Moreover, in the present embodiment, as described above, the unwanted electric charge discharging channel RL of the accumulation well 4 and the residual electric charge discharging channel RC from the modulation well 5, which is adjacently arranged, are set to mutually different channels. Then, by providing the LOD transistor TL and the clear transistor TC which control the potential barrier of these two channels, respectively, discharging of the unwanted electric charge from the accumulation well 4 and discharging of the residual electric charges from the modulation well 5 can be securely carried out in terms of potential. Control of the LOD transistor TL and the clear transistor TC is carried out by providing the gate signal to each of the LOD gate 12 or the clear gate 14 from the vertical drive scanning circuits 65 and 66, respectively. In addition, the drain drive circuit 67 provides a drain voltage to the drain of each modulation transistor TM.

In addition, in the present embodiment, the modulation transistor TT and the transfer transistor TM are controlled by the gate signal provided in common from the vertical drive scanning circuit 64 through the ring transfer gate 6 that is integrally formed. Namely, in order to control the modulation transistor TT and the transfer transistor TM, the presence of a common drive circuit and a gate line (contact wiring) is good enough, which is extremely advantageous in terms of the cell layout.

Relationship between Accumulating Period and Reading Period

FIG. 6 is a timing chart for illustrating each driving period in the present embodiment. In addition, FIG. 6 shows the driving sequence in the normal mode as will be described later. In FIG. 6, L1, L2 and so on correspond to each line of the sensor cell array 62.

The accumulating period is set to a period common to all the cells, as will be described later. However, the reading is carried out for each line. The reading timing differs for each line, and the reading period (blanking period) for each line is shown as the pulse shape in FIG. 6. Hereinafter, the line where the reading is carried out is referred to as a reading line, and each cell of the reading line is referred to as a reading cell. Moreover, lines other than the reading line are referred to as non-reading lines, and each cell for the non-reading lines is referred to as a non-reading cell.

Reading Period

In the present embodiment, the reading period (blanking period) comprises an S (signal) modulation period, a clear period, and an N (noise) modulation period. In order to remove the variation between cells 3 and various kinds of noises, a signal component and a noise component are read from the same cell to compare. In the S modulation period, an S modulation operation for reading the pixel signal based on the photo-generated electric charges accumulated in the modulation well 5 is carried out. In the clear period, a clear operation for discharging the photo-generated electric charges remaining in the modulation well 5 through the residual electric charges discharging channel RC is carried out in order to read the noise component. In the N modulation period, in order to read the noise component from the modulation well 5, an N modulation operation, which reads the pixel signal after the clear, is carried out.

Accumulating Period

In the present embodiment, provision is made to carry out the accumulation operation (parallel accumulation operation) to the accumulation well 4 even in the blanking period. Namely, the S modulation period, the clear period, and the N modulation period in the blanking period are, in terms of the accumulation, a parallel accumulating period Ss at the time of the S modulation, the parallel accumulating period Sc at the time of the clear, and a parallel accumulating period Sn at the time of the N modulation, respectively.

The accumulating period according to the present embodiment includes besides a parallel accumulating period which is the same period as the blanking period, a single accumulating period Sa where the single accumulation operation is carried out. The pixel signal read in the blanking period is stored in a line memory (corresponding to the signal output circuit 69 of FIG. 4). The pixel signal for one line portion is sequentially outputted per one pixel from this line memory, and the reading from each cell of the following line is carried out after the outputting of the line memory is completed. Therefore, the reading from the cell of the following line cannot be carried out until the outputting from the line memory is completed, and thus the single accumulating period Sa is set to a period required to transfer and output (line-out) the pixel signal from such a line memory.

Sequence in Frame

In the present embodiment, for example, as shown in FIG. 6, one frame period is constituted cyclically repeating the single accumulating period Sa and the parallel accumulating periods Ss, Sc, and Sn, after the transfer period and the PD clear period, as will be described later. All the cells 3 of the sensor cell array 62 cyclically repeat operations of the single accumulating period Sa and the parallel accumulating periods Ss, Sc, and Sn. Then, only the period shown with the pulse shape of FIG. 6 among the parallel accumulating periods Ss, Sc, and Sn is set in the blanking period for each line (as becoming the reading cell), and the reading operation is carried out. In one frame period, the single accumulating period Sa and the blanking period are repeated a number of times based on the number of lines.

In the single accumulating period Sa and the parallel accumulating periods Ss, Sc, and Sn, the photo-generated electric charges are successively accumulated in the accumulation well 4, as will be described later. As shown in FIG. 6, a time period from the completion of the PD clear period to the completion of a frame period is the accumulating period, and the photo-generated electric charges accumulated, in this period, in the accumulation well 4 will be transferred from the accumulation well 4 to the modulation well 5 in the transfer period, which is the leading period of the following frame, as shown in FIG. 6, and are stored. In the transfer period, all the cells carry out the transfer operation as will be described later.

Next, the PD clear period, which is very short, is set up in order to discharge the photo-generated electric charges generated from the completion of the transfer period before the start of the accumulating period. In the PD clear period, unwanted electric charges are discharged from the accumulation well 4 of all the cells. In addition, the PD clear period is used for setting up the length of the accumulating period, and in the normal mode, the PD clear period can be omitted.

Looking at a predetermined line, for example, in each cell in a line L1 as the reading cell at the modulation transistor TM side, during the blanking period as shown in FIG. 6, the S modulation operation, the clear operation, and the N modulation operation are carried out. At the same time, at the accumulation well 4 side, the parallel accumulation operation Ss at the time of the S modulation, the parallel accumulation operation Sc at the time of the clear, and the parallel accumulation operation Sn at the time of the N modulation are carried out. During the period other than this blanking period, as for the non-reading cell, the single accumulation operation Sa, the parallel accumulation operation Ss at the time of the S modulation, the parallel accumulation operation Sc at the time of the clear, and the parallel accumulation operation Sn at the time of the N modulation are cyclically repeated.

Namely, in any cell, all the periods except for the transfer period and the PD clear period are set as the single or the parallel accumulating period, and the parallel accumulation operation is also carried out especially during the blanking period of the reading cell. Then, the accumulated photo-generated electric charges are transferred to the modulation well 5 in the transfer period at the beginning of the following frame. Namely, the period from the completion of the PD clear period (the completion of the transfer period in case that the PD clear period is omitted) of the preceding frame to the start of the transfer period is the accumulating period for each cell, and the pixel signal used for blanking is based on the photo-generated electric charges accumulated in the accumulating period of the preceding frame.

Potential

Next, with reference to FIG. 7 and FIG. 8, the operations in the single accumulating period Sa, the transfer period, the S modulation period (parallel accumulating period Ss), the clear period (parallel accumulating period Sc), and the N modulation period (parallel accumulating period Sn) and the PD clear period will be described based on the potential relationship. FIG. 7 is a diagram illustrating the potential relationship for each period, with the direction, where the hole potential becomes high, being positive side. FIG. 7A shows the condition at the time of the single accumulation. FIG. 7B shows the condition at the time of the transfer, FIG. 7C shows the condition at the time of the S modulation or the N modulation (S/N modulation). FIG. 7D shows the condition at the time of the clear, and FIG. 7E shows the condition at the time of the clear (PD clear) of the accumulation well 4 in a high-speed shutter mode. The column on the left side of FIG. 7 shows the condition of the reading cell, and the column of the right side shows the condition of the non-reading cell. In addition, FIG. 7 shows the potential changes based on the electric charges, with a satin pattern. Moreover, as described above, whether each cell becomes either the reading cell or the non-reading cell is indicated by the pulse of FIG. 6.

FIG. 7 shows the potential relationship for each position, taking the position corresponding to the cutting line of each cell of FIG. 2 in the horizontal axis, and taking the potential with reference to the hole in the vertical axis. From the left side to the right side in FIG. 7, the potentials in the substrate at the positions of: the discharging contact region (Sub), the clear gate (CG) 14 (residual electric charge discharging channel portion), one end side of the carrier pocket (PKT) 10, the source (S), the other end side of the carrier pocket (PKT) 10, the transfer gate portion (TX) 6b (transfer channel RT portion), an accumulation well region (PD), and the LOD gate (LOD) 12 (unwanted electric charge discharging channels RL portion) and the OD contact region (Sub), are shown.

Moreover, FIG. 8 shows the changes of the driving voltage for each period. In FIG. 8, the dashed lines show the changes of the driving voltage of a select line. FIG. 8 shows the changes of the driving voltage for each period, and the actual driving sequence and the order of the period to set differ. FIG. 8 shows a setup of the driving voltage shown in FIG. 7 in time order (sequentially). In addition, as for the blanking period, in FIG. 8, the driving voltage for the reading cell is shown with the dashed line and the driving voltage for the non-reading cell is shown with the solid line.

The potential of each part changes corresponding to the driving voltage. For example, if the source voltage and the drain voltage or the like are increased or decreased, the potential of the surroundings will increase or decrease as well. For example, the potential of the accumulation well 4 is influenced mainly by both the applied voltages to the source and to the drain of the modulation transistor TM. Moreover, the potential of the modulation well 5 will be increased or decreased mainly corresponding to the ups and downs of the gate voltage of the modulation transistor TM.

In the present embodiment, the same drive is carried out to all the cells in the single accumulating period Sa shown in FIG. 7A. As also shown in FIG. 8, in the single accumulating period Sa shown in FIG. 7A. 1.5V is applied to the ring transfer gate (RG) 6, 2.5V is applied to the clear gate 14, 1.0V is applied to the LOD gate 12, 1.0V is applied to the drain D, and 1.0V is applied to the source. The drain voltage is set to a relatively low value.

In the single accumulating period, the potential barrier of the transfer channel RT between the accumulation well 4 and the modulation well 5 is made sufficiently high by the transfer transistor TT. Moreover, the potential barrier of the unwanted electric charge discharging channel RL between the accumulation well 4 and the OD contact region 11 is made sufficiently high by the LOD transistor TL. Furthermore, the potential of the potential barrier of the transfer channel RT is made higher than the potential of the potential barrier of the unwanted electric charge discharging channel RL. The accumulation well 4 is set at a relatively, high concentration, and its potential before the accumulation of the electric charges is relatively low. When the accumulation is started, the electric charges are generated by light entered from the opening region 2 of the photo-diode PD, and are accumulated in the accumulation well 4. FIG. 7A shows the potential increase by the accumulation of the electric charges, with a satin pattern.

In the present embodiment, the potential barrier of the unwanted electric charge discharging channel RL and the potential barrier of the transfer channel RT are sufficiently high (potential is high), and the electric charges generated by incident light are accumulated in the accumulation well 4, without being transferred to the modulation well 5. Even if an extremely strong light is entered, the potential barrier of the transfer channel RT is higher than the potential barrier of the unwanted electric charge discharging channel RL, therefore, the electric charges which overflow from the accumulation well 4 are discharged to the OD contact region 11 through the unwanted electric charge discharging channel RL, and will not flow into the modulation well 5.

In the transfer period shown in FIG. 7B, 0.0V is applied to the ring transfer gate (RG) 6, 2.5V is applied to the clear gate 14, 2.5V is applied to the LOD gate 12, 4.0V is applied to the drain D, and 0.0V is applied to the source.

Since 0V is applied to the ring transfer gate 6, the potential barrier of the transfer channel RT becomes sufficiently low. Accordingly, the electric charges accumulated in the accumulation well 4, in the single accumulating period Sa described above and in the parallel accumulating periods Sa, Sc, and Sn, as will be described later, flow into the modulation well 5 through the transfer channel RT. In addition, by setting the drain voltage to a relatively high voltage, the potential gradient is increased and thus the transfer of the electric charges is made easy.

In addition, the potential barrier of the discharging channel by the clear gate 14 is also set sufficiently high, and the electric charges stored in the modulation well 5 will not flow out into the discharging channel side. Moreover, also in the transfer period shown in FIG. 7B, all the cells become the reading cells and the same drive is carried out.

The reading period includes the signal modulation (S modulation) period for mainly reading the signal component (S), the noise modulation (N modulation) period for mainly reading the noise component (N), and the clear period for clearing the residual electric charges in order to read the noise component. By reading the signal component and the noise component to compare, the picture signal, in which the cell variation and the various kinds of noises are removed, is obtained. Namely, in the reading period, the S modulation period, the clear period, and the N modulation period are carried out in this order.

The same control is carried out in the S modulation period and the N modulation period. In the S/N modulation period shown in FIG. 7C, with respect to the reading cell, as shown in the dashed line of FIG. 8, 2.5V is applied to the ring transfer gate (RG) 6, 2.5V is applied to the clear gate 14, 1.0V is applied to the LOD gate 12, and 2.5V is applied to the drain D. Vg−Vths (=2.5−Vths) arises at the source (Vg is the gate voltage and Vths is the threshold voltage of the channel at the time of the S modulation).

The reading is carried out for each line. Only each cell of one line (reading line) out of all the lines becomes a reading cell, and each cell of other lines (non-reading lines) is a non-reading cell. Then, upon completion of the reading of each reading cell from the reading line, the reading line shifts, and each cell of the following line becomes a reading cell, and other cells become the non-reading cells. Similarly, the reading (S modulation) of the signal component or the reading (N modulation) of the noise component is carried out by shifting the reading line.

As for the reading cell, the potential barrier of the transfer channel RT by the transfer transistor TT is made high so that the electric charges stored in the modulation well 5 may not flow into the accumulation well 4. Since the voltage of the ring transfer gate 6 is made high, the source potential increases accordingly. The threshold voltage of the channel of the modulation transistor TM changes corresponding to the electric charges stored in the carrier pocket 10. Namely, the source potential of the modulation transistor TM becomes the one corresponding to the generated amount of the photo-generated electric charges, i.e., the incident light, because the photo-generated electric charges accumulated in the accumulation well 4 of the photo-diode PD are transferred to the carrier pocket 10.

In addition, as for the non-reading cell, as shown in the solid line of FIG. 8, 1.5V is applied to the ring transfer gate (RG) 6, 2.5V is applied to the clear gate 14, 1.0V is applied to the LOD gate 12, and 2.5V is applied to the drain D. Also in this case, Vg−Vths (=0−Vths) arises in the source, however, since the voltage of the ring transfer gate 6 is low, the output of the non-reading cell becomes a level sufficiently lower than the output of the reading cell. Therefore, only the output pixel signal of the reading cell appears at the source line.

In addition, since the potential difference applied to the ring transfer gate 6 of the reading cell and of the non-reading cell is made sufficiently high, even if, for example, the picture is dark or the like, the output pixel signal of the reading cell can be taken out from the source line securely.

In the clear period shown in FIG. 7D, as for the reading cell, as shown in the dashed line of FIG. 8, 1.5V is applied to the ring transfer gate (RG) 6, 0.0V is applied to the clear gate 14, 1.0V is applied to the LOD gate 12, 2.5V is applied to the drain D, and 5.0V is applied to the source.

Accordingly, the potential barrier of the discharging channel by the clear gate 14 is lowered sufficiently, and the electric charges remaining in the modulation well 5 are flowed from the discharging channel to the discharging contact region 15. Accordingly, the photo-generated electric charges in the modulation well 5 are removed, thereby enabling the reading of the noise component (noise modulation).

On the other hand, as for the non-reading cell, as shown in the solid line of FIG. 8, 1.5V is applied to the ring transfer gate (RG) 6, 2.5V is applied to the clear gate 14, 1.0V is applied to the LOD gate 12, 2.5V is applied to the drain D, and 5.0V is applied to the source. Accordingly, the potential barrier of the residual electric charge discharging channel by the clear gate 14 is kept high.

The reading of the non-reading cell out of the cells per each line has already been completed after the blanking period passed in FIG. 6, however, as for the non-reading cells of the line before the blanking period passes, the reading has not been carried out yet. Then, as for the non-reading cells, by keeping the potential barrier of the discharging channel by the clear gate 14 high, the electric charges are prevented from being discharged from the modulation well 5. The satin pattern portions with respect to the non-reading cell of FIGS. 7C and 7D indicates that the electric charges, which have not been read, are stored in the modulation well 5.

According to the present embodiment, as described above, the parallel accumulation operation is carried out in the S/N modulation period and the clear period. FIGS. 7C and 7D show this parallel accumulation operation. Namely, in the reading period (S/N modulation and clear period), the photo-generated electric charges are accumulated in the accumulation well 4 by increasing the potential barrier of the transfer channel RT and the unwanted electric charge discharging channel RL. Accordingly, the reading period (modulation period and clear period) of the modulation transistor TM will be the accumulating period (parallel accumulating periods Ss, Sn, and Sc) for accumulating the photo-generated electric charges at the photo-diode PD side. In addition, in the parallel accumulating period Ss and Sn of FIG. 7C, and the parallel accumulating period Sc of FIG. 7D, the drain voltage is higher as compared with the single accumulating period Sa, and thus the conditions of accumulating the photo-generated electric charges differ. Moreover, as shown in FIGS. 7C and 7D, the conditions of accumulating the photo-generated electric charges differ slightly between the reading cell and the non-reading cell.

Thus, in the single accumulating period Sa, the S/N modulation period, and the clear period, accumulation of the photo-generated electric charges are carried out in all the cells, and the accumulation time for each cell will be approximately one frame period as shown in FIG. 6. In this manner, provision is made to separately constitute the accumulation well 4 for accumulating the electric charges which is formed at the photo-diode PD side, and the modulation well 5 which is formed at the modulation transistor TM side, and to control the potential barrier of the transfer channel RT between both by the transfer transistor TT. Accordingly, the accumulation well 4 and the modulation well 5 can be set in the reading period and the parallel accumulating period of the same period, and thus the frame rate can be enhanced.

The PD clear period which is an initialization period shown in FIG. 7E is adopted in the high-speed shutter mode or in the low-speed shutter mode, as will be described later. As shown in FIG. 8, 1.5V is applied to the ring transfer gate (RG) 6, 2.5V is applied to the clear gate 14, 0.0V is applied to the LOD gate 12, 4.0V is applied to the drain D, and the source is made high impedance (High-Z). In addition, the driving voltage when the PD clear period is used in the normal mode is also the same as that of FIG. 7E.

The potential barrier of the unwanted electric charge discharging channel RL is made sufficiently low by lowering the voltage applied to the LOD gate, and the unwanted electric charges accumulated in the accumulation well 4 are discharged from the unwanted electric charge discharging channel RL to an external signal line through the OD contact region 11. In addition, in case that PD clear operation is adopted in the normal mode as shown in FIG. 6, the residual electric charges will not be left in the modulation well 5 portion of FIG. 7E.

In addition, in the S/N modulation period, secured reading from the reading cell can be carried out as the difference of the voltages applied to the ring transfer gates (RG) 6 of a reading cell and a non-reading cell becomes larger. However, if the voltage applied to the ring transfer gate (RG) 6 of the non-reading cell is set to 0V, the potential barrier in the transfer channel (RT) also decreases because the gates of the modulation transistor TM and the transfer transistor TT are integrally constituted, and there is a concern that the electric charges of the accumulation well 4 may flow into the modulation well 5. For this reason, in the present embodiment, with respect to the non-reading cell, 1.5V is applied to the ring transfer gate portion 6.

Driving Sequence

Next, the operation sequence regarding each mode of the normal mode, the high-speed shutter mode and the low-speed shutter mode will be described.

FIG. 9 and FIG. 10 are timing charts showing the driving sequences. FIG. 9 shows the normal mode, FIG. 10A shows the high-speed shutter mode and FIG. 10B shows the low-speed shutter mode.

In the normal mode of FIG. 9, the same operation as that of FIG. 6 as described above is carried out. In addition, in the normal mode of FIG. 9, the PD clear period is omitted. Moreover, in FIG. 9 and FIG. 10, the single accumulating period Sa (line-out period) and the blanking period of FIG. 6 are combined to be shown as one pulse shape. In addition, as described above, the single accumulating period Sa is a time required for transferring data from the line memory, and actually needs time longer than the blanking period.

In the normal mode of FIG. 9, each cell has the accumulating period of one frame period except for the transfer period, and the reading from all the cells completes in one frame period. Since the parallel accumulating period is set up using time common to the blanking period, it is not necessary to prepare another period for the accumulation, and thereby the frame rate can be enhanced.

FIG. 10A shows the driving sequence in the high-speed shutter mode.

The high-speed shutter mode is used, for example, for shortening the accumulating period. In addition, in the conventional examples, since provision is made to discharge the residual electric charges of the first well upon completion of the blanking, the high-speed shutter mode or the like according to the present embodiment cannot be implemented.

For example, when an extremely bright light is incident upon the photo-diode PD, the amount of the electric charges that flow into the modulation well 5 of each cell increases extremely, and the picture based on the pixel signal read from each cell will be whitish (bright) as a whole and the contrast thereof will degrade. In such a case, the high-speed shutter mode is adopted. In the high-speed shutter mode, as shown in FIG. 10A, the PD clear period is set to an arbitrary position in one frame period. As described above, the accumulating period is a period from the completion of the PD clear in the preceding frame to the starting time of the transfer period.

As shown in FIG. 7E, in the PD clear period, the electric charges accumulated in the accumulation well 4 are discharged to the outside through the OD contact region 11. Accordingly, the photo-generated electric charges generated after the completion of the PD clear period are accumulated in the accumulation well 4. After the completion of the PD clear period, the single accumulating period Sa and the parallel accumulating periods Ss, Sc, and Sn are cyclically repeated until the completion of the frame period. Thus, after the accumulation is carried out only for the time shorter than the one frame period corresponding to the position of the PD clear period, the photo-generated electric charges accumulated in the accumulation well 4 are transferred to the modulation well 5 in the transfer period at the beginning of the frame.

The reading is the same as that of the normal mode, and while the reading line is sequentially shifting, the reading of all lines completes in one frame period. In addition, as for the cell where the reading has not been completed, as shown in FIG. 7E, the electric charges are being stored in the modulation well 5, and can be read in one frame period regardless of the accumulating period based on the position of the PD clear period.

For example, in case that the PD clear period is set to the approximate center of one frame period, the accumulating period will be about a half of one frame period, and the amount of the electric charges which flow into the modulation well 5 will be about a half of that of the normal mode, and the brightness of the picture based on the pixel signal read from each cell can be made adequate. Thereby, the picture having sufficient contrast, though it is bright, can be obtained.

In addition, since the PD clear period can be easily set up by applying the driving voltage shown in FIG. 8 to each part, the PD clear period can be arranged in an arbitrary position corresponding to the brightness of the picture. Therefore, the accumulating period can be set up without restraint, and the pixel signal having an optimal level corresponding to the brightness of the picture can be obtained from each cell.

FIG. 10B shows the driving sequence in the low-speed shutter mode.

The low-speed shutter mode is used, for example, for making the accumulating period longer than one frame period. For example, in case that light incident upon the photo-diode PD is dark, the amount of the electric charges which flow into the modulation well 5 of each cell will decrease, and the picture based on the pixel signal read from each cell will be dark as a whole. In such a case, the low-speed shutter mode is adopted. In the low-speed shutter mode, while the PD clear period is inserted once per a plurality of frame periods, the transfer period is inserted once per a plurality of frames.

In an example of FIG. 10B, the PD clear period is inserted once per two frame periods, and the transfer period is set at the leading timing of the frame of one and a half frame periods after the completion of this PD clear period. Therefore, the accumulating period in this case will be one and a half frame periods. Thereby, the picture having approximately one and a half times brightness as compared with the normal mode can be obtained. In addition, in the case of FIG. 10B, the reading from each cell will be carried out only once per two frame periods, and the frame rate will be a half of the normal mode.

By adopting the shutter mode of FIGS. 10A and 10B, the accumulating period can be set up without restraint, and the optimal picture corresponding to the brightness of incident light can be obtained.

In addition, also in the low-speed shutter mode, the reading is carried out within approximately one frame period after the transfer period. Conventionally, the accumulated photo-generated electric charges are also discharged by reading, therefore, in the following one frame period after reading, a dummy-reading involving the clear operation which does not contribute to the picture signal, cannot be carried out. On the other hand, in the present embodiment, since the reading operation can be carried out simultaneously with the accumulation of the photo-generated electric charges, the dummy-reading involving the clear operation can be carried out even in the following one frame period after reading. Accordingly, there is an advantage that the configuration of the logic circuit or the like for performing the reading can be simplified.

Process

Next, a method of manufacturing an element will be explained with reference to process flowcharts of FIG. 11 through FIG. 13. FIG. 11 through FIG. 13 show the cross-section at the position of the A–A' cutting line of FIG. 2. In FIG. 11 through FIG. 13, the arrows above the substrate indicate that an ion implanting is carried out, the black dots indicate the material to be implanted, and the frames indicate a mask. Moreover, in the view, LOD Tr, Clr Tr, R.G Tr, and Tx Tr indicate the LOD transistor TL formation region, the clear transistor TC formation region, the modulation transistor TM formation region, and the transfer transistor TT formation region, respectively.

Figure 11A:
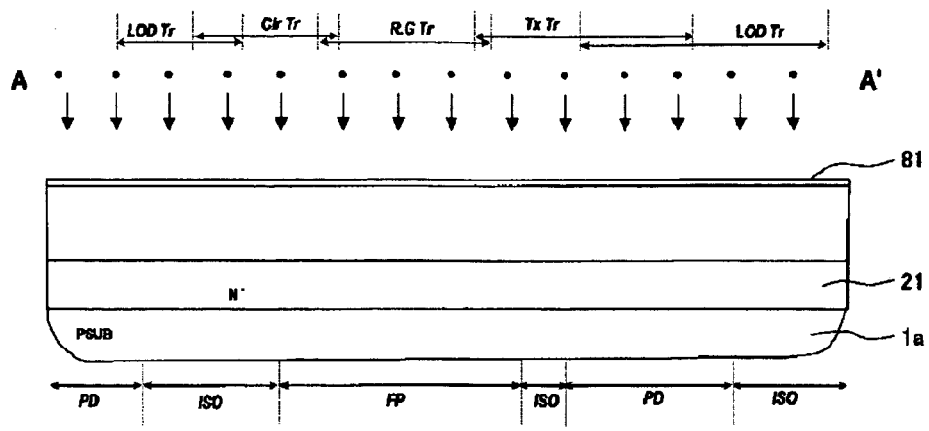
FIGS. 11A through 11C are process flowcharts for explaining a method of manufacturing the element.

As shown in FIG. 11A, a 20 nm sacrificing oxidization layer 81 is formed in the surface of a prepared P substrate 1. Next, phosphorus (P) ions are ion-implanted with an acceleration energy of 2 Mev, setting the dose amount at (4 through 5)×10E12 pieces/cm². In addition, hereinafter, such ion implantation will be expressed as (P, 2 MeV, 4e12, in case of P ions of 2 MeV and 4×10E12 pieces/cm²). Furthermore, an ion implanting of (P, (1 through 1.5) MeV, (1.5 through 1.8) e12) is carried out. Accordingly, as shown in FIG. 11A, the N type well 21 of N⁻ is formed at a relatively deep position. In addition, such consecutive ion implantations will be expressed as (material, acceleration energy, dose-amount/material, acceleration energy, dose amount).

Figure 11B:
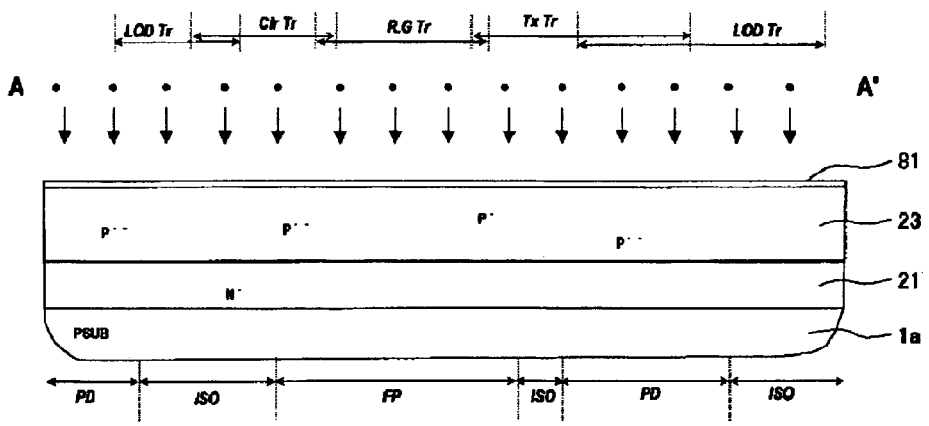

Next, as shown in FIG. 11B, a P⁻⁻ layer 23 is formed in the entire element on the N type well 21. For example, b, carrying out an ion-implanting of (Boron (B), 200 KeV, 6e11/B. 120 KeV, 5e11), the P⁻⁻ layer 23 is formed in the entire surface of the substrate.

Figure 11C:
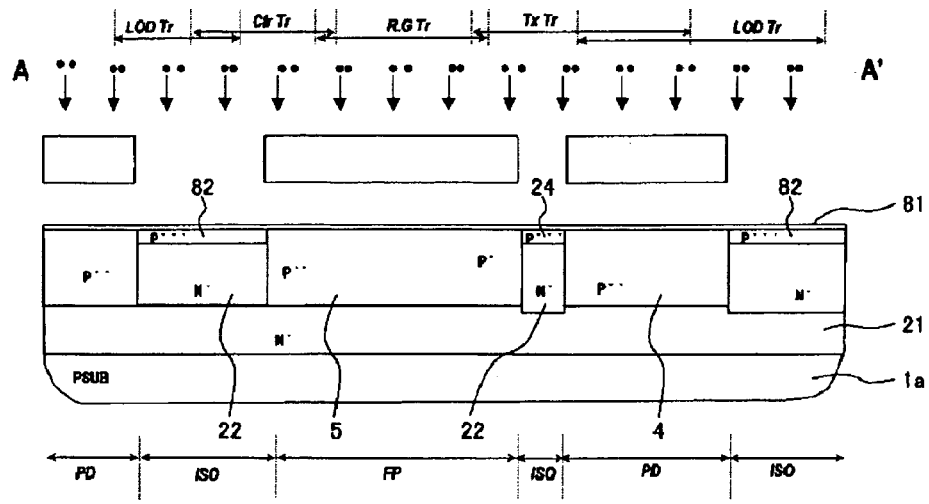

Next, as shown in FIG. 11C, an isolation region 22 (N⁻layer) for isolating elements is formed to divide the P⁻⁻ layer 23 into the accumulation well 4 and the modulation well 5. Namely, the isolation region 22 is formed in all the regions between the accumulation well 4 and the modulation well 5, within its own cell and between the adjacent cells. This isolation region 22 is formed through resist by carrying out, for example, an ion implanting of (P, 400 KeV, 6 e12/P, 150 KeV, 3 e11).

Furthermore, on the surface of the formed isolation region 22, P⁻⁻⁻ Layers 24 and 82, which become the channel doping of the modulation transistor TM, the LOD transistor TL, and the clear transistor TC, are formed. This channel dope is formed by an ion implanting of (B, 10 KeV, 2.5e12), and at this time, is formed all over the isolation region 22 surface.

Figure 12A:
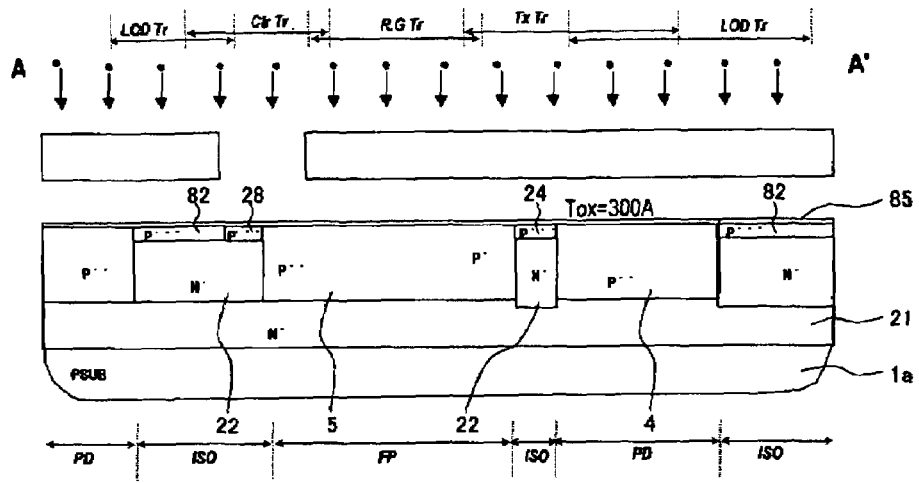
FIGS. 12A through 12C are process flowcharts for explaining the method of manufacturing the element.

Next, after removing the sacrifice oxidization layer 81 in the substrate surface, as shown in FIG. 12A, a gate oxidization layer 85 with a thickness of approximately 30 nm is formed in the substrate surface by thermal oxidization. Subsequently, boron as the channel doping for the clear transistor TC is additionally implanted. This channel dope (P⁻⁻⁻ diffusion layer 28) is formed by an ion implanting of (B, 10 KeV, 3e12). Accordingly, the threshold voltage Vth of the clear transistor TC is lowered than the Vth of other transistors. That is, the potential under the clear gate 14 is made relatively low, and thus the discharging of the residual electric charges in the modulation well 5 is made easy. Especially, the potential of the modulation well 5 is originally low, therefore, it is necessary to keep the channel threshold voltage Vth of the clear transistor TC sufficiently low.

Figure 12B:
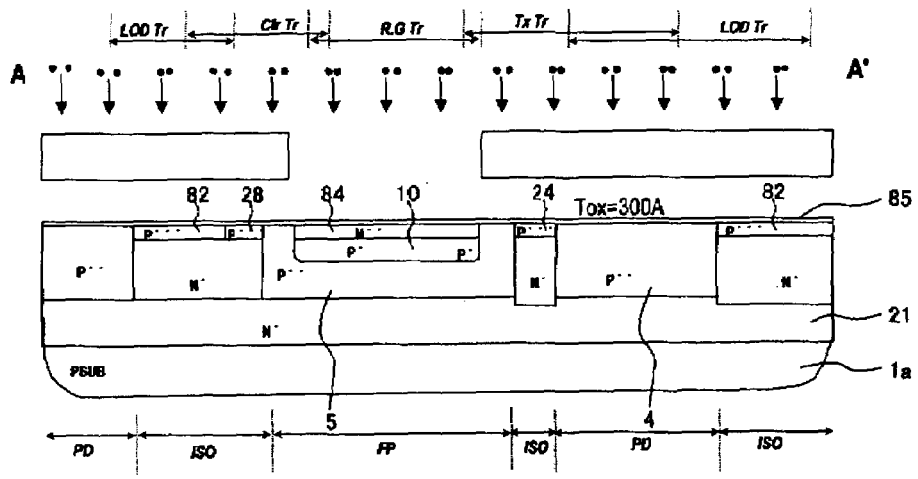

Next, as shown in FIG. 12B, in the P⁻⁻ layer 23 (modulation well 5) under the ring gate portion 6a, a carrier pocket 10 with a heavy P⁻ diffusion layer is formed. This carrier pocket 10 is formed, for example, by an ion implanting of (B, 30 KeV, 1.7e12). Furthermore, near the substrate surface on the carrier pocket 10, an N⁻⁻ layer 84 for obtaining the channel of the modulation transistor TM is formed. This N⁻⁻ layer 84 is formed, for example, by an ion implanting of (arsenic (As), 90 KeV, 4e11).

Figure 12C:
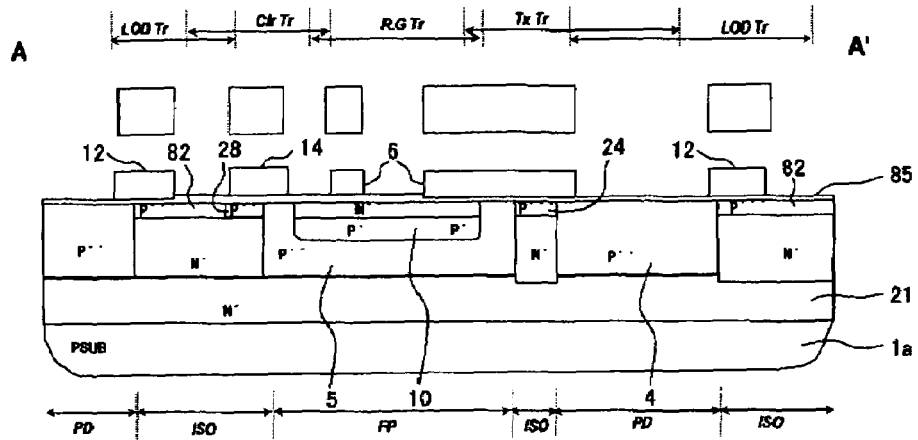

Next, as shown in FIG. 12C, in the modulation transistor TM formation region, the transfer transistor TT formation region, the LOD transistor TL formation region, and the clear transistor TC formation region on the gate oxidization layer 85, respectively, the ring transfer gate 6 comprising the ring gate portion 6a and the transfer gate portion 6b, the LOD gate 12, and the clear gate 14, are formed.

Figure 13A:
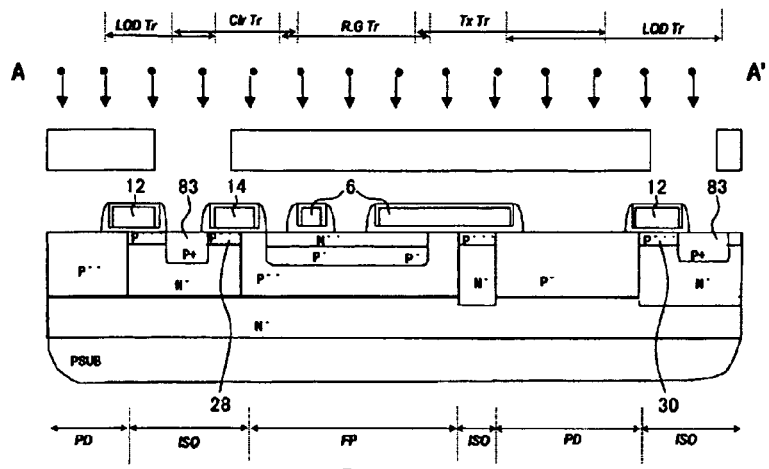
FIGS. 13A through 13C are process flowcharts for explaining the method of manufacturing the element.

Next, as shown in FIG. 13A, after forming an oxidization layer on the ring transfer gate 6, on the LOD gate 12, and on the clear gate 14, respectively, in order to form, in the position adjacent to the clear gate 14, the discharging contact region 15 and the OD contact region 11, which are coupled to the channel region of the clear transistor TC, a heavy P⁺⁺ layer 83 is formed in the substrate surface. In addition, in the present embodiment, the discharging contact region 15 and the OD contact region 11 are combined to be used, and constitute the diffusion layer 28 as the channel for the clear transistor TC at one side of the P++layer 83, and constitute the diffusion layer 30 as the channel for the LOD transistor TL at the other side. In addition, the discharging contact region 15 and the OD contact region 11 may be provided separately.

The P⁺⁺ layer 83 is formed, for example, by an ion implanting of (B, 30 KeV, 1e13). Next, a sidewall is formed in each gate, respectively so as to hang over the oxidization layer on the ring transfer gate 6, the LOD gate 12, and the clear gate 14.

Figure 13B:
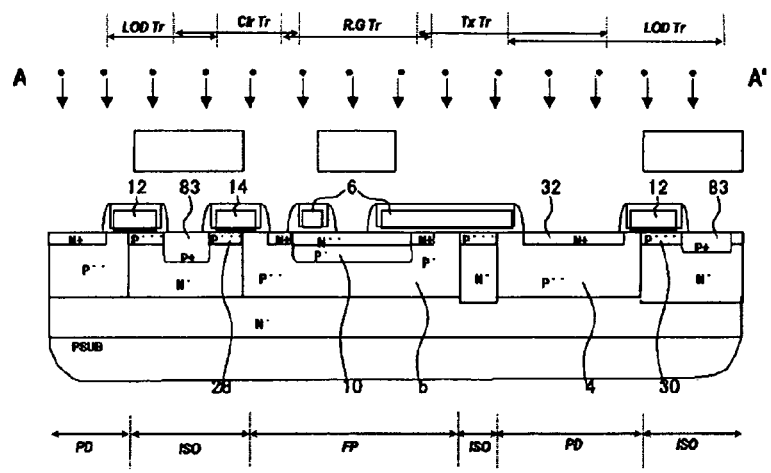

Next, as shown in FIG. 13B, an N⁺ layer 32 is formed, through resist, in the substrate surface of the photo-diode PD formation region, and in the substrate surface between the ring transfer gate 6 and the clear gate 14. The N⁺ layer 32 is formed by carrying out an ion implanting of (As, 80 KeV, 1e13) in a P⁻⁻⁻ layer in the substrate surface.

Figure 13C:
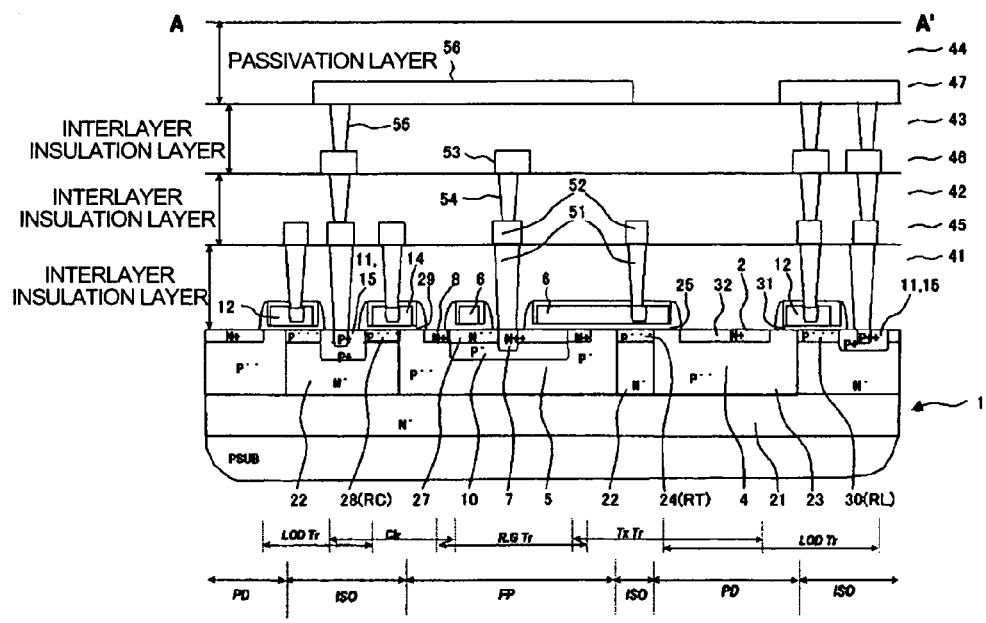

Next, as shown in FIG. 13C, an interlayer insulation layer 41 is formed in the substrate surface, and the contact hole 51 is opened on the LOD gate 12, the discharging and OD contact regions 15 and 11, the source region, the ring transfer gate 6, and the drain region 8 (not shown) of this interlayer insulation layer 41. Next, an N⁺⁺ impurity implanting is carried out to the LOD gate 12, the source region and the ring transfer gate 6, and the drain region 8, through the opened contact holes 51, thereby each gate contact, the source region 7, and the drain contact region 9 are formed. Next, by carrying out a P⁺⁺ impurity implanting to the discharging and OD contact formation region through the opened contact hole 51, the discharging and OD contact regions 15 and 11 are formed.

Next, the LOD gate 12, the discharging and OD contact regions 15 and 11, the source region 7 and the ring transfer gate 6, and the drain contact region 9 are coupled to each wiring 52 of the lower-layer wiring layer 45 by embedding wiring material, such as aluminum, in each contact holes 51.

Furthermore, the upper-layer wiring layer 46 is formed through the interlayer insulation layer 43 on the lower-layer wiring layer 45 including these wiring 52, and is coupled to each wiring 52 of the lower-layer wiring layer 45 through the contact hole 54. Furthermore, the light-shielding layer 56 is formed on the upper-layer wiring layer 46 through the interlayer insulation layer 43, and a part of the upper-layer wiring layer 46 is coupled to the light-shielding layer 56. Finally, a passivation layer 44 is formed on the light shielding layer 47.

In the present embodiment, the discharge and OD contact regions 15 and 11 are coupled to the light-shielding layer 56 through the contact hole 51 opened in the interlayer insulation layer 41 and the contact holes 54 which open the interlayer insulation layer 42. The light-shielding layer is an indispensable structure for the image sensor, and the discharging of the residual electric charges and the unwanted electric charges are made easy using this indispensable structure.

Effect of the Embodiment

Thus, in the present embodiment, the accumulation well 4 for accumulating the photo-generated electric charges is formed in the photoelectric conversion element formation region, and the modulation well 5, which is potentially independently separated from the accumulation well 4, is formed in the modulation transistor TM formation region. Then, the transfer transistor TT for controlling the potential barrier between the accumulation well 4 and the modulation well 5 is provided, and at the same time the speeding up of the frame rate is realized by allowing the accumulating period and the blanking period to be carried out at the same time.

In this case, the potential of the residual electric charge discharging channel RC and the unwanted electric charge discharging channel RL is set lower than the potential of the transfer channel RT. Accordingly, in periods other than the transfer period, the electric charges are not transferred between the modulation well 5 and the accumulation well 4, and even when strong light is entered or the like, the photo-generated electric charges which overflow from the accumulation well 4 are allowed to flow to the OD contact region side 11, not to the modulation well 5 side. Moreover, the electric charges that overflow from the modulation well 5 are also allowed to flow to the discharging contact region 15 side, not to the accumulation well 4 side, and secured reading and accumulating operation can be carried out.

Furthermore, in the present embodiment, the residual electric charges from the modulation well 5, after being transferred in the lateral direction, are discharged from the discharging contact region 15 through the external wiring, and the flexibility on the impurity profile design in the modulation transistor formation region can be improved.

Moreover, the unwanted electric charges including the residual electric charges from the modulation well 5 and the electric charges that overflow from the accumulation well 4 are discharged through the external signal line coupled to the contact regions 15 and 11, and it is not necessary to form a deep over-drain region extending from the substrate to the substrate surface, and both a higher quality picture and miniaturization can be realized satisfactorily.

Moreover, the gate of the modulation transistor TM and the gate of the transfer transistor TT are integrally constituted to drive these transistors TM and TT by the common gate line, therefore, the wiring and the drive circuits can be reduced and the flexibility of the cell layout can be improved.

Figure 14:
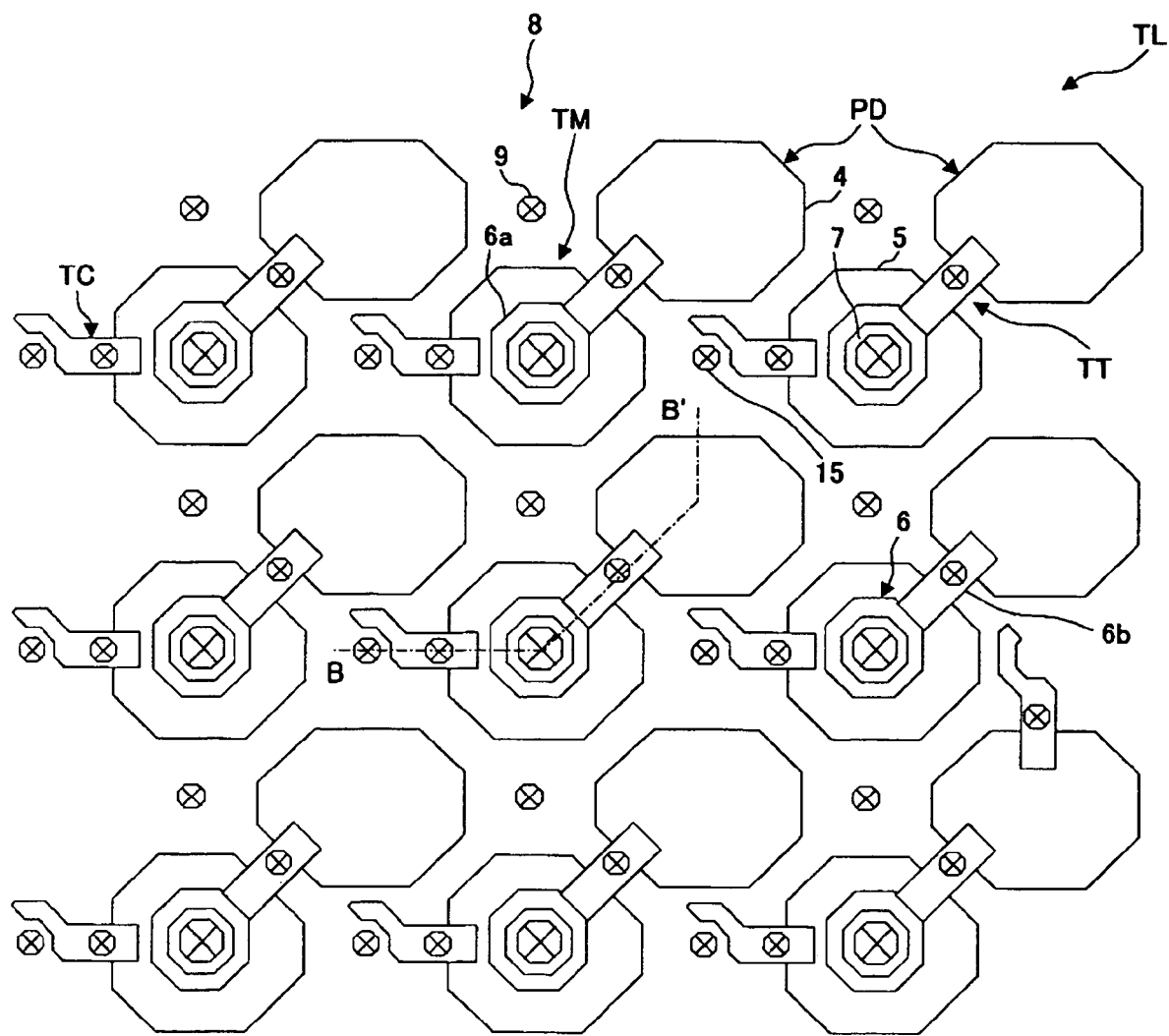
FIG. 14 is a plan view showing a planar shape of a solid state imaging device of a second embodiment.
Figure 15:
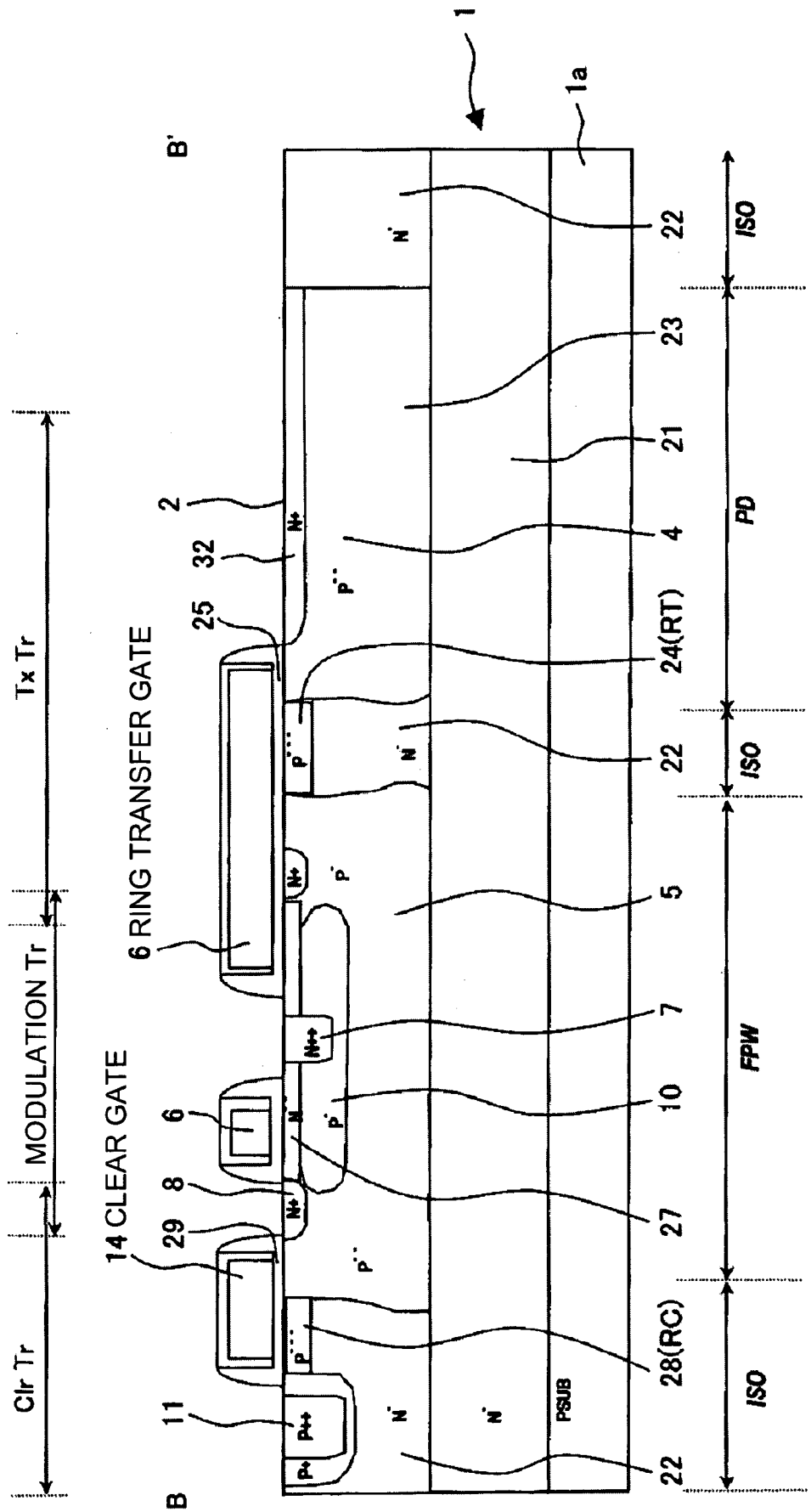
FIG. 15 is a sectional view showing the cross-section cut along the B–B' line of FIG. 14.
Figure 16:
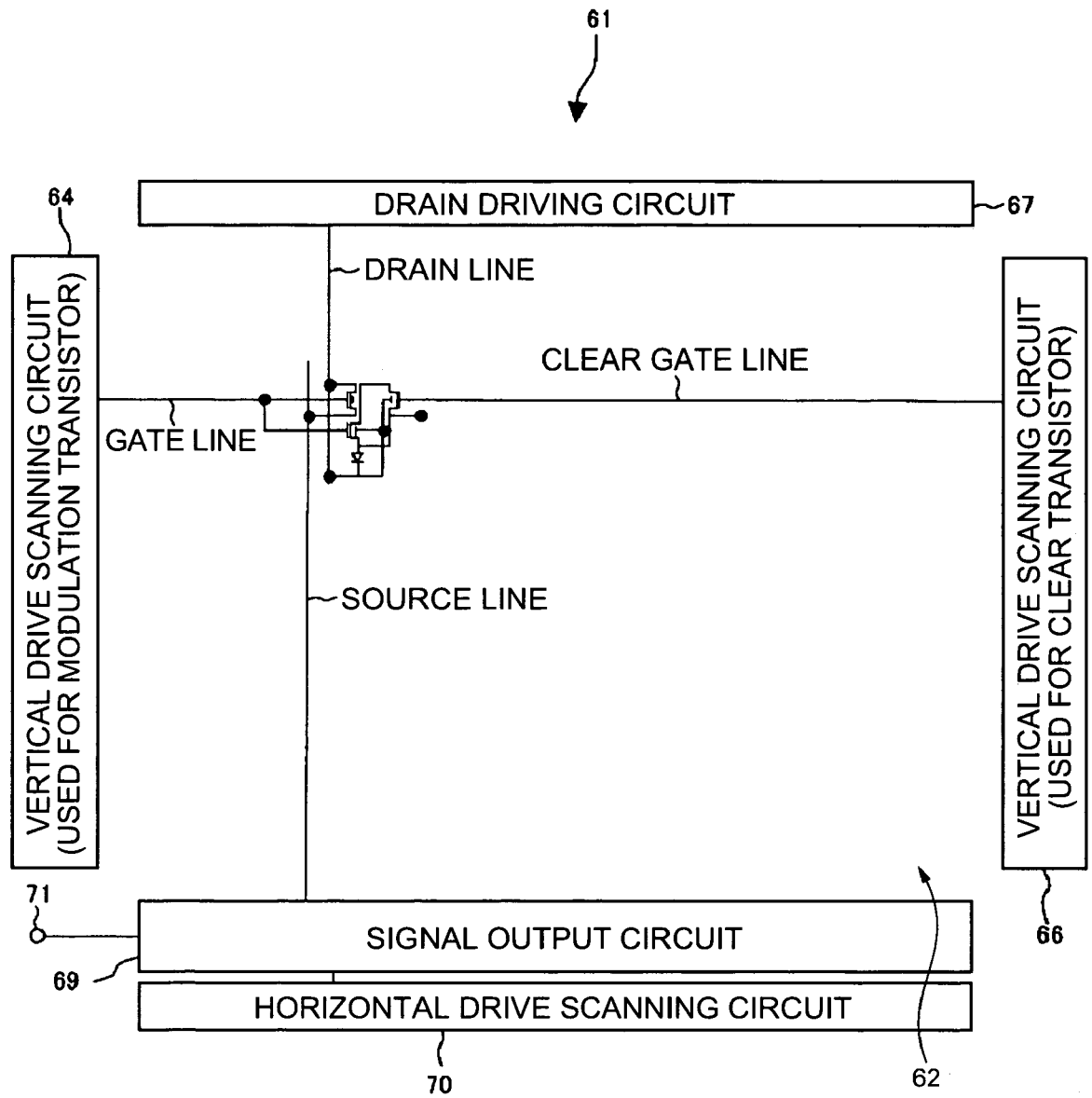
FIG. 16 is a block diagram showing the entire structure of the element of the second embodiment.
Figure 17A:
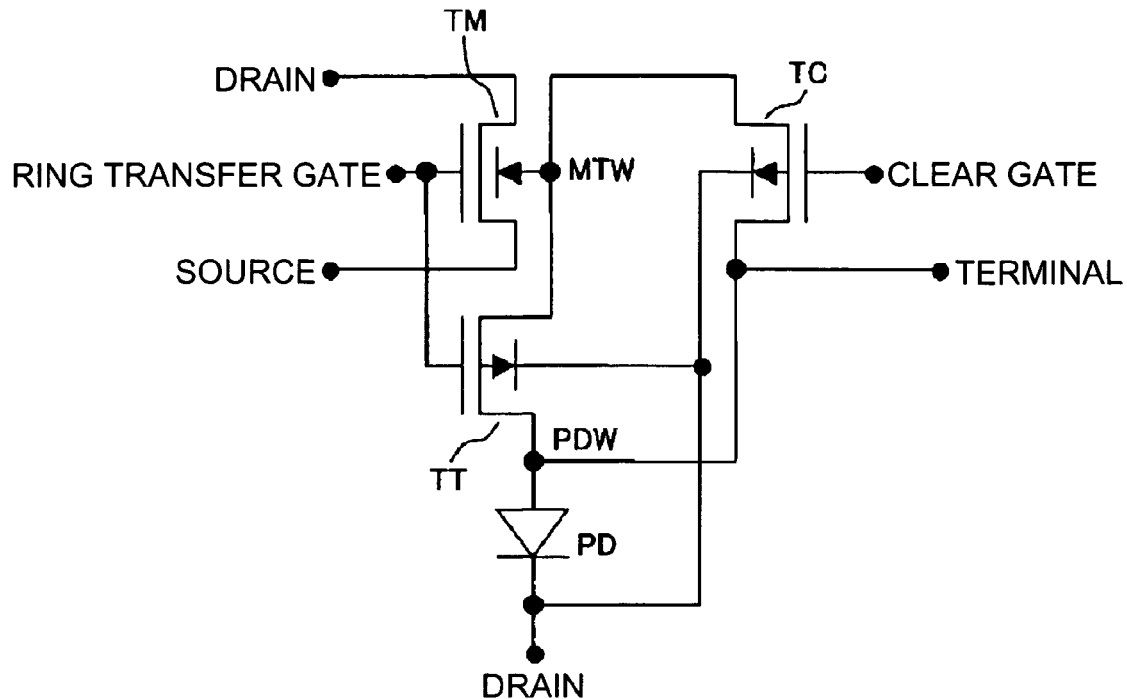
FIGS. 17A and 17B are equivalent circuit diagrams of the sensor cell of the second embodiment.
Figure 17B:
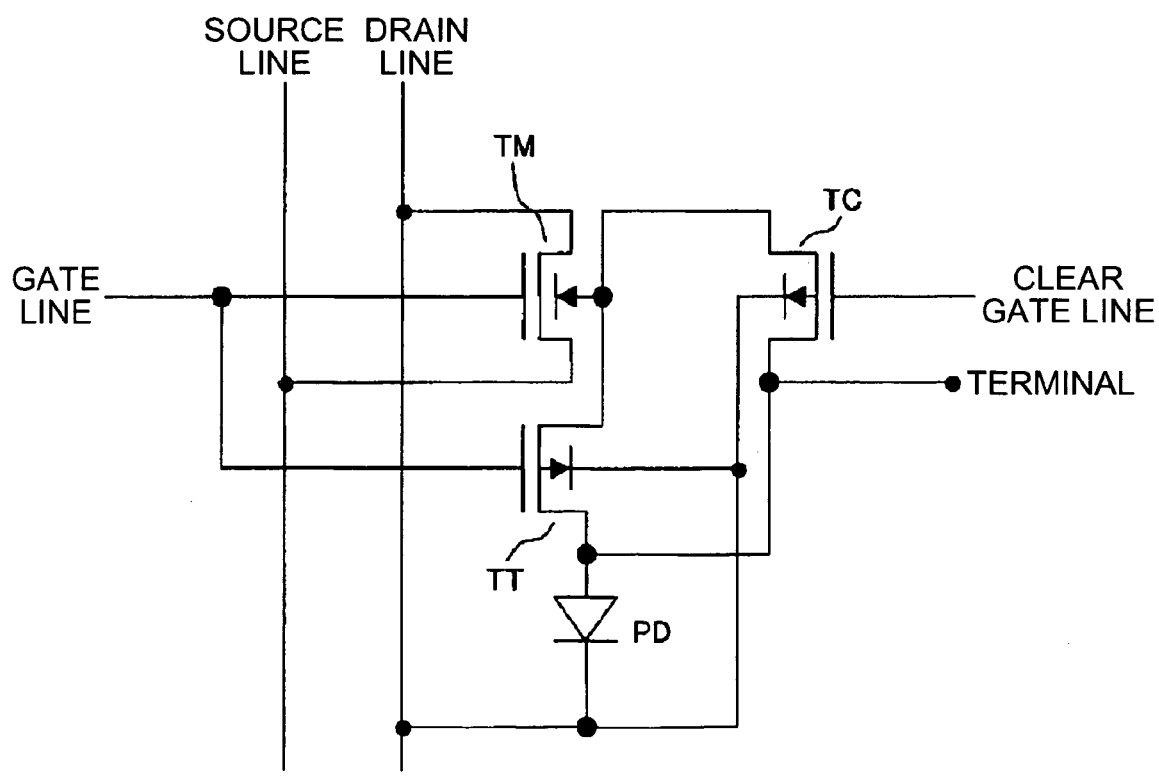
Figure 18A:
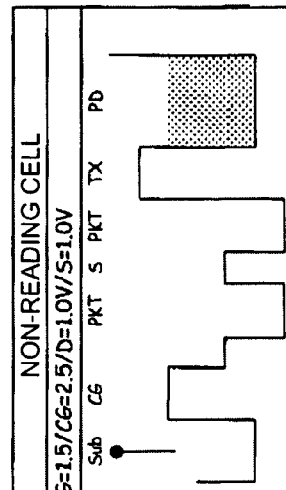
FIGS. 18A through 18D are diagrams showing the potential relationship for each period of the second embodiment.
Figure 18B:
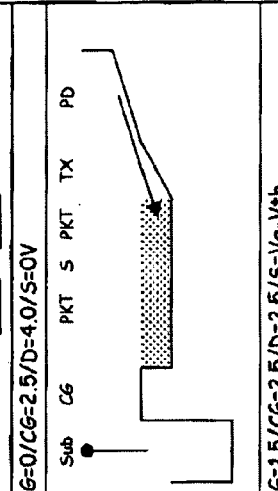
Figure 18C:
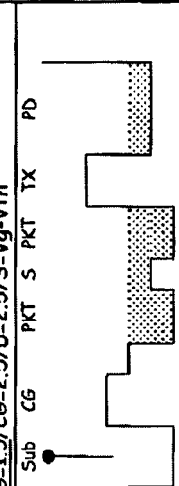
Figure 18D:
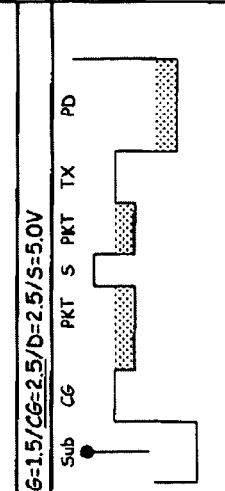
Figure 19:
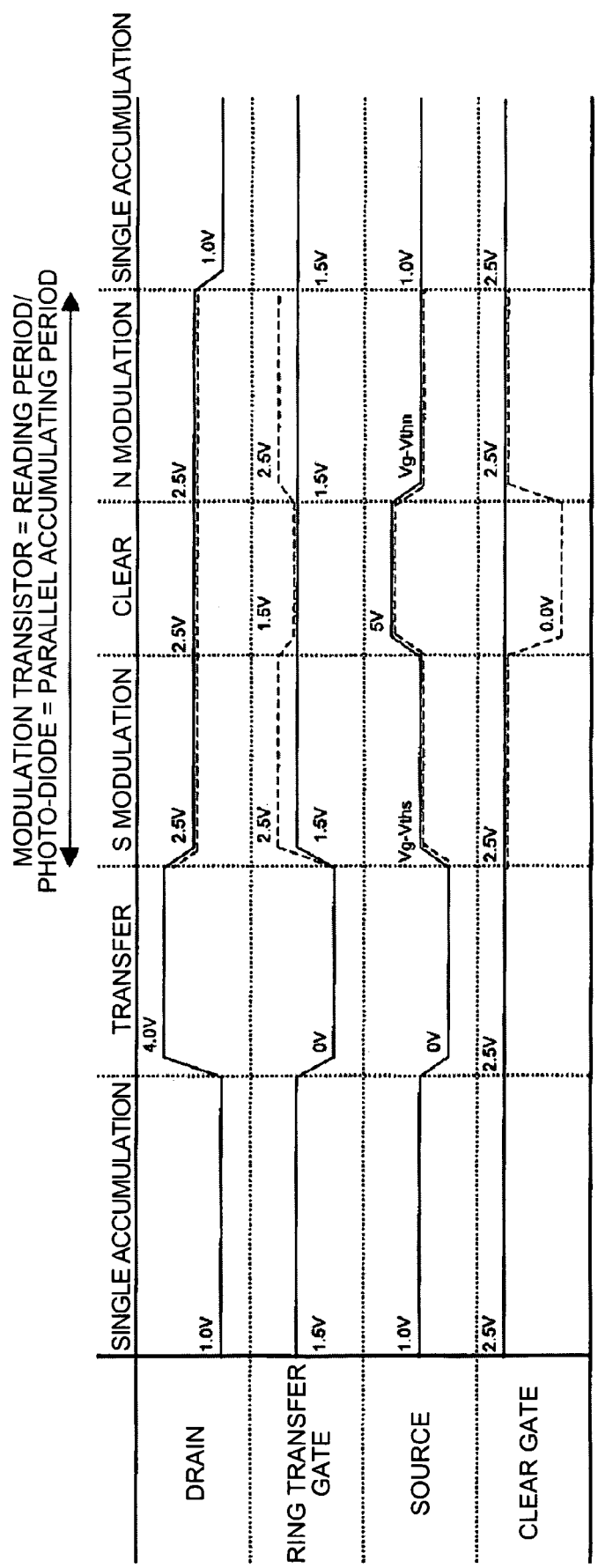
FIG. 19 is a diagram showing changes of the driving voltage in each period in the driving sequence of the second embodiment.

FIG. 14 through FIG. 20 are related to a second embodiment of the present invention, and FIG. 14 is a plan view showing a planar shape of a solid state imaging device of the present embodiment, and FIG. 15 is a cross-sectional view showing the cross section cut along the B–B' line of FIG. 14. FIG. 16 is a block diagram showing the entire structure of the element, and FIG. 17 is an equivalent circuit diagram of the sensor cell. FIG. 18 is a diagram illustrating the potential relationship for each period, with the direction, where the hole potential becomes high, being positive side, and FIG. 19 is a diagram showing the changes of the driving voltage for each period in the driving sequence. FIG. 20 is the timing chart showing the driving sequences. In addition, in FIG. 14 through FIG. 20, the same reference numerals are given to the same configuration elements as those of FIG. 1, FIG. 3 through FIG. 5, and FIG. 7 through FIG. 10, respectively, and the description thereof will be omitted.

In the present embodiment, the only difference from the first embodiment is that the LOD transistor TL, the OD contact region 11, and the unwanted electric charge discharging channel RL are omitted. Namely, as shown in FIG. 14 and FIG. 15, the unwanted electric charge discharging channel RL coupled to the accumulation well 4 of the photo-diode PD is not formed, and the LOD transistor TL and the OD contact region 14 are not formed either. In addition, the discharging contact region 15 is formed. Other structure is the same as those of FIG. 1 through FIG. 3.

Even when the sensor cell constituted this way is used, the accumulating period and the blanking period can be carried out in the same period like the first embodiment.

Namely, also in the present embodiment, by controlling the transfer channel RT by the transfer transistor TT, in the accumulating period, the electric charges transfer between the modulation well 5 and the accumulation well 4 is prevented, and thus the photo-generated electric charges can be accumulated in the accumulation well 4. Moreover, before reading the pixel signal, the displacement of the electric charges between the modulation well 5 and the discharging contact region 15 is prevented, and the photo-generated electric charges transferred from the accumulation well 4 can be stored in the modulation well 5.

In addition, in the present embodiment, since the PD clear by the LOD transistor TL cannot be carried out, the accumulating period of the accumulation well 4 is determined by the transfer period in which the potential barrier of the transfer channel RT is lowered by the transfer transistor TT. Namely, the period from the completion of the transfer period to the start of the following transfer period is the accumulating period.

Moreover, also in the present embodiment, near the substrate surface, the residual electric charge discharging channel RC by the clear gate 14 is formed, and the residual electric charges in the modulation well are discharged in the substrate lateral direction. Accordingly, the design flexibility of the impurity profile in the modulation transistor TM formation region is extremely high. Then, the residual electric charges from the modulation well 5, after being transferred in the horizontal direction, are discharged from the discharging contact region 15 through the wiring in the substrate. Accordingly, it is not necessary to form a deep over-drain region extending from the substrate to the substrate surface, and both higher quality picture and miniaturization can be realized satisfactorily.

Next, the circuit configuration of the entire solid state imaging device according to the present embodiment will be described with reference to FIG. 16. In addition, FIG. 17 shows a specific circuit configuration of each sensor cell in FIG. 16.

In the present embodiment, as shown in FIG. 17, in each cell, the LOD transistor TL is omitted. Therefore, as shown in FIG. 16, the vertical drive scanning circuit 65 for driving the LOD transistor is omitted from the circuit configuration of the entire solid state imaging device.

Also in the present embodiment, the driving sequence is the same as that of FIG. 6 except that the PD clear period is not included. Namely, the accumulating period is set to a period common to all the cells. The reading period (blanking period) is constituted by the S (signal) modulation period, the clear period, and the N (noise) modulation period. Then, also in the present embodiment, the S modulation period, the clear period, and the N modulation period in the blanking period will be, in terms of accumulation, the parallel accumulating period Ss at the time of the S modulation, the parallel accumulating period Sc at the time of the clear, and the parallel accumulating period Sn at the time of the N modulation, respectively. Moreover, the accumulating period includes, besides the parallel accumulating period in the same period as the blanking period, the single accumulating period Sa where the single accumulation operation is carried out. Thus, one frame period is constituted cyclically repeating the single accumulating period Sa and the parallel accumulating periods Ss, Sc, and Sn, after the transfer period.

Moreover, the photo-generated electric charges accumulated in the accumulation well 4 are transferred, in the transfer period from the accumulation well 4 to the modulation well 5 and are stored. All the cells carry out the transfer operation in the transfer period. Then, the period of this transfer period to the transfer period will be made the accumulating period.

Next, with reference to FIG. 18 and FIG. 19, the operation in the single accumulating period Sa, the transfer period, the S modulation period (parallel accumulating period Ss), the clear period (parallel accumulating period Sc) and the N modulation period (parallel accumulating period Sn), will be described based on the potential relationship. FIG. 18 is a diagram illustrating the potential relationship for each period with the direction, where the hole potential becomes high, being positive side. FIG. 18A shows the condition at the time of the single accumulation, FIG. 18B shows the condition at the time of the transfer, FIG. 18C shows the condition at the time of the S modulation or the N modulation (S/N modulation), and FIG. 18D shows the condition at the time of the clear. The column on the left side of FIG. 18 shows the condition of the reading cell, and the column on the right side shows the condition of the non-reading cell. In addition, FIG. 18 shows the potential change based on the electric charges, with a satin pattern. In addition, the timing when each cell becomes the reading cell will be shown by the pulse portion of FIG. 20, as will be described later.

FIG. 18 shows the potential relationship of each position, taking the position corresponding to the cutting line of each cell of FIG. 14 in the horizontal axis, and taking the potential with reference to the hole in the vertical axis. From the left side to the right side in FIG. 18, the potentials in the substrate at the positions of the discharging contact region (Sub), the clear gate (CG) 14 (residual electric charge discharging channel portion), one end of the carrier pocket (PKT) 10, the source (S), the other end of the carrier pocket (PKT) 10, the transfer gate portion (TX) 6*b* (transfer channel RT portion), the accumulation well region (PD), are shown.

Moreover, FIG. 19 shows the changes of the driving voltage for each period. In FIG. 19, the dashed lines show the changes of the driving voltage of the select line. FIG. 19 shows the changes of the driving voltage for each period, and the actual driving sequence and the order of the period to set up differ. FIG. 19 shows a setup of the driving voltage shown in FIG. 18 in time order.

In the present embodiment, the same drive is carried out to all the cells in the single accumulating period Sa as shown in FIG. 18A. As shown also in FIG. 19, in the single accumulating period Sa shown in FIG. 18A, 1.5V is applied to the ring transfer gate (RG) 6, 2.5V is applied to the clear gate 14, 1.0V is applied to the drain D, and 1.0V is applied to the source. The drain voltage is set to a relatively low value.

In the single accumulating period, the potential barrier of the transfer channel RT between the accumulation well 4 and the modulation well 5 is made sufficiently high by the transfer transistor TT. The accumulation well 4 is set at a relatively high concentration, and its potential before the accumulation of the electric charges is relatively low. When the accumulation is started, the electric charges are generated by light entered from the opening region 2 of the photo-diode PD, and are accumulated in the accumulation well 4. FIG. 18A shows the potential increase by the accumulation of the electric charges, with a satin pattern.

Also in the present embodiment, the potential barrier of the transfer channel RT is sufficiently high (potential is high), and the electric charges generated by incident light are accumulated in the accumulation well 4, without being transferred to the modulation well 5.

In the transfer period shown in FIG. 18B, 0.0V is applied to the ring transfer gate (RG) 6, 2.5V is applied to the clear gate 14, 4.0V is applied to the drain D, and 0.0V is applied to the source.

Since 0V is applied to the ring transfer gate 6, the potential barrier of the transfer channel RT becomes sufficiently low. Accordingly, the electric charges accumulated in the accumulation well 4 in the above described single accumulating period Sa and in the parallel accumulating periods Sa, Sc, and Sn, as will be described later, flow into the modulation well 5 through the transfer channel RT. In addition, by setting the drain voltage to a relatively high voltage, the potential gradient is increased to facilitate the transfer of the electric charges.

In addition, the potential barrier of the discharging channel by the clear gate 14 is also set sufficiently high, and the electric charges stored in the modulation well 5 will not flow out into the discharging channel side. Moreover, also in the transfer period shown in FIG. 18B, all the cells become the reading cells, and the same drive is carried out.

The reading period includes the signal modulation (S modulation) period for mainly reading the signal component (S), the noise modulation (N modulation) period for mainly reading the noise component (N), and the clear period for clearing the residual electric charges in order to read the noise component. By reading and comparing the signal component and the noise component, the picture signal in which the cell variation and the various kinds of noises are removed is obtained. Namely, the S modulation period, the clear period, and the N modulation period are carried out in this order in the reading period.

The same control is carried out in the S modulation period and in the N modulation period. In the S/N modulation period shown in FIG. 18C, with respect to the reading cell, as shown in the dashed line of FIG. 19, 2.5V is applied to the ring transfer gate (RG) 6, 2.5V is applied to the clear gate 14, and 2.5V is applied to the drain D. Vg−Vths (=2.5−Vths) arises in the source (Vg is the gate voltage and Vths is the threshold voltage of the channel at the time of the S modulation).

The reading is carried out for each line. Only each cell of one line (reading line) out of all the lines becomes a reading cell, and each cell of other lines (non-reading lines) is a non-reading cell. Then, upon completion of reading each reading cell from the reading line, the reading line shifts, and each cell of the following line becomes a reading cell, and other cells become the non-reading cells. Similarly, the reading (S modulation) of the signal component or the reading (N modulation) of the noise component is carried out shifting the reading line.

As for the reading cell, the potential barrier of the transfer channel RT by the transfer transistor TT is made high so that the electric charges stored in the modulation well 5 may not flow out into the accumulation well 4. Since the voltage of the ring transfer gate 6 is made high, the source potential increase accordingly. The threshold voltage of the channel of the modulation transistor TM changes corresponding to the electric charges stored in the carrier pocket 10. Namely, the source potential of the modulation transistor TM becomes the one corresponding to the generated amount of the photo-generated electric charges, i.e. the incident light, because the photo-generated electric charges accumulated in the accumulation well 4 of the photo-diode PD are transferred to the carrier pocket 10.

In addition, as for the non-reading cell, as shown in the solid line of FIG. 19, 1.5V is applied to the ring transfer gate (RG) 6, 2.5V is applied to the clear gate 14, and 2.5V is applied to the drain D. Also in this case, Vg−Vth (=0−Vth) arises in the source, however, since the voltage of the ring transfer gate 6 is low, the output of the non-reading cell becomes a level sufficiently lower than the output of the reading cell. Therefore, only the output pixel signal of the reading cell appears at the source line.

In addition, the potential difference applied to the ring gate portion 6a of the reading cell and the non-reading cell is made sufficiently high, therefore, for example, even when the picture is dark or the like, the output pixel signal of the reading cell can be taken out from the source line securely.

In the clear period shown in FIG. 18D, as for the reading cell, as shown in the dashed line of FIG. 19, 1.5V is applied to the ring transfer gate (RG) 6, 0.0V is applied to the clear gate 14, 2.5V is applied to the drain D, and 5.0V is applied to the source.

Accordingly, the potential barrier of the discharging channel by the clear gate 14 is lowered sufficiently, and the electric charges remaining in the modulation well 5 are flowed from the discharging channel to the discharging contact region 15. Accordingly, the photo-generated electric charges in the modulation well 5 are removed, thereby enabling the reading of the noise component (noise modulation).

On the other hand, as for the non-reading cell, as shown in the solid line of FIG. 19, 1.5V is applied to the ring transfer gate (RG) 6, 2.5V is applied to the clear gate 14, 2.5V is applied to the drain D, and 5.0V is applied to the source. Accordingly, the potential barrier of the residual electric charge discharging channel by the clear gate 14 is kept high. The reading of the non-reading cell out of the cells per each line has already been completed after the blanking period passed in FIG. 6, however, as for the non-reading cells of lines before the blanking period passes, the reading has not been carried out yet. Then, with respect to the non-reading cell, the potential barrier of the discharging channel by the clear gate 14 is kept high, and the electric charges are prevented from being discharged from the modulation well 5. The satin pattern portion of FIG. 18 with respect to the non-reading cell shows that the electric charges, which have not been read, are stored in the modulation well 5.

According to the present embodiment, as described above, in the S/N modulation period and the clear period, the parallel accumulation operation is carried out. FIGS. 18C and 18D show this parallel accumulation operation. Namely, in the reading period (S/N modulation and clear period), the photo-generated electric charges are accumulated in the accumulation well 4 by increasing the potential barrier of the transfer channel RT. Accordingly, the reading period (modulation and clear period) of the modulation transistor TM will be made the accumulating period (parallel accumulating periods Ss, Sn, and Sc) for accumulating the photo-generated electric charges at the photo-diode PD side. In addition, in the parallel accumulating period Ss and Sn of FIG. 18C, and the parallel accumulating period Sc of FIG. 18D, the drain voltage is higher as compared with the single accumulating period Sa, and thus the conditions for accumulating the photo-generated electric charges differ. Moreover, as shown in FIGS. 18C and 18D, the conditions for accumulating the photo-generated electric charges differ slightly between the reading cell and the non-reading cell.

Thus, in the single accumulating period Sa, the S/N modulation period, and the clear period, the accumulation of the photo-generated electric charges is carried out in all the cells, and the accumulation time for each cell will be approximately one frame period. In this way, provision is made to separately constitute the accumulation well 4 for accumulating the electric charges formed at the photo-diode PD side and the modulation well 5 formed at the modulation transistor TM side, and to control the potential barrier of the transfer channel RT between the both by the transfer transistor TT. Accordingly, the accumulation well 4 and the modulation well 5 can be set to the reading period and the parallel accumulating period of the same period, and thereby the frame rate can be enhanced.

Next, the operation sequence of each mode of the normal mode and the low-speed shutter mode will be described.

FIG. 20 is a timing chart showing the driving sequence. FIG. 20A shows the normal mode and FIG. 20B shows the low-speed shutter mode. In FIG. 20, the single accumulating period Sa (line-out period) and the blanking period are combined to be shown as one pulse shape.

In the normal mode of FIG. 20A, each cell has the accumulating period of one frame period except for the transfer period, and the reading from all the cells completes in one frame period. Since the parallel accumulating period is set up using a time common to the blanking period, it is not necessary to prepare another period for the accumulation, and thereby the frame rate can be enhanced.

FIG. 20B shows the driving sequence of the low-speed shutter mode.

The low-speed shutter mode is used, for example, for making the accumulating period longer than one frame period. In the low-speed shutter mode according to the present embodiment, the transfer period is inserted once per a plurality of frame periods.

In an example of FIG. 20B, the transfer period is inserted once per two frame periods, and the next transfer period is set up in two frame periods after the completion of this transfer period. Therefore, the accumulating period in this case will be made two frame periods. Accordingly, a picture having approximately two times brightness as compared with the normal mode can be obtained. In addition, in the case of FIG. 20B, the reading from each cell will be carried out only once per two frame periods, and the frame rate will be one half of the normal mode.

Thus, also in the present embodiment, the same effect as that of the first embodiment can be obtained.

What is claimed is:

1. A solid state imaging device, comprising:
    a substrate;
    a photoelectric conversion element in the substrate that generates photo-generated electric charges corresponding to incident light;
    an accumulation well that accumulates the photo-generated electric charges;
    a modulation well that stores the photo-generated electric charges transferred from the accumulation well;
    a modulation transistor having a channel threshold voltage that is controlled by the photo-generated electric charges stored in the modulation well and that outputs a pixel signal corresponding to the photo-generated electric charges;
    a transfer control element having a control end that is integrated with a control end of the modulation transistor and that changes a potential barrier of a transfer channel between the accumulation well and the modulation well, and controls transfer of the photo-generated electric charges, wherein the control end of the transfer control element and the modulation transistor correspond to a single ring transfer gate that is controlled by a single driving voltage supplied by a common drive circuit;
    an unwanted electric charge discharging control element that controls the potential barrier of an unwanted electric charge discharging channel coupled to the accumulation well, wherein the unwanted electric charge discharging control element discharges the photo-generated electric charges that overflow from the accumulation well through the unwanted electric charge discharging channel during a period except a transfer period of the photo-generated electric charges from the accumulation well to the modulation well by the transfer control element; and
    a residual electric charge discharging control element that controls the potential barrier of the residual electric charge discharging channel coupled to the modulation well, and discharges the residual electric charges in the modulation well through the residual electric charge discharging channel.

2. The solid state imaging device according to claim 1, wherein the residual electric charge discharging control element, during a period except the transfer period of the photo-generated electric charges from the accumulation well to the modulation well by the transfer control element, discharges the electric charges that overflow from the modulation well through the residual electric charge discharging channel.

3. The solid state imaging device according to claim 1, wherein the unwanted electric charge discharging control element determines an accumulating period of the photo-generated electric charges in the accumulation well by discharging the photo-generated electric charges accumulated in the accumulation well at a predetermined time.

4. The solid state imaging device according to claim 1, wherein the residual electric charge discharging channel extends in the substrate lateral direction.

5. The solid state imaging device according to claim 1, wherein the residual electric charge discharging channel and the unwanted electric charge discharging channel are coupled to external wiring through a terminal on the substrate.

6. A method of driving a solid state imaging device, including:
    an accumulation well that accumulates photo-generated electric charges generated by a photoelectric conversion element corresponding to incident light;
    a modulation well that controls a threshold voltage of a channel of a modulation transistor by storing the photo-generated electric charges;
    a transfer control element having a control end integrated with a control end of the modulation transistor and that controls a potential barrier of a transfer channel between the accumulation well and the modulation well, wherein the control end of the transfer control element and the modulation transistor correspond to a single ring transfer gate that is controlled by a single driving voltage supplied by a common drive circuit;
    an unwanted electric charge discharging control element that controls the potential barrier of an unwanted electric charge discharging channel coupled to the accumulation well, and
    a residual electric charge discharging control element that controls the potential barrier of a residual electric charge discharging channel coupled to the modulation well;
    the method comprising:
    a single accumulation step of controlling the potential barrier of the transfer channel and the unwanted electric charge discharging channel by the transfer control element and the unwanted electric charge discharging control element, and accumulating the photo-generated electric charges by the photoelectric conversion element into the accumulation well so that the photo-generated electric charges will not flow to the modulation well at least through the transfer channel;
    a reading step including:
        a signal component modulation step of controlling the potential barrier of the residual electric charge discharging channel and the transfer channel by the residual electric charge discharging control element and the transfer control element, and outputting a pixel signal corresponding to the photo-generated electric charges from the modulation transistor, while having the modulation well store the photo-generated electric charges;

a discharging step of controlling the potential barrier of the residual electric charge discharging channel by the residual electric charge discharging control element, and the discharging residual electric charges of the modulation well through the residual electric charge discharging channel; and a noise component modulation step of controlling the potential barrier of the residual electric charge discharging channel and the transfer channel by the residual electric charge discharging control element and the transfer control element, and reading a noise component from the modulation transistor after the discharging step;

a parallel accumulation step of controlling the potential barrier of the transfer channel and the unwanted electric charge discharging channel by the transfer control element and the unwanted electric charge discharging control element, and accumulating the photo-generated electric charges by the photoelectric conversion element into the accumulation well so that the photo-generated electric charges may not flow to the modulation well at least through the transfer channel during the same period as the signal component modulation step, the discharging step, and the noise component modulation step; and a transfer step of controlling the potential barrier of the transfer channel by the transfer control element, and transferring and storing the photo-generated electric charges accumulated in the accumulation well to the modulation well.

7. The method of driving a solid state imaging device according to claim 6, wherein the transfer step is carried out after the single accumulation step, the reading step and the parallel accumulation step carried out in the same period are repeated a number of times based on the number of lines per one screen.

8. The method of driving a solid state imaging device according to claim 6, further comprising an initialization step of controlling the potential barrier of the transfer channel and the unwanted electric charge discharging channel by the transfer control element and the unwanted electric charge discharging control element during an arbitrary period within one screen period, and discharging the photo-generated electric charges accumulated in the accumulation well through the unwanted electric charge discharging channel, wherein the transfer step is carried out after the single accumulation step, the reading step and the parallel accumulation step that are carried out in the same period are repeated a number of times based on the number of lines per one screen and the timing within one screen period in the initialization step.

9. The method of driving a solid state imaging device according to claim 8, further comprising a high-speed shutter mode wherein the period from the initialization step to the transfer step is shorter than one screen period.

10. The method of driving a solid state imaging device according to claim 8, further comprising a low-speed shutter mode wherein the period from the initialization step to the transfer step is longer than one screen period.

* * * * *